(12) United States Patent
Parker

(10) Patent No.: US 7,187,181 B2
(45) Date of Patent: Mar. 6, 2007

(54) ARC DETECTION METHOD UTILIZING A DYNAMIC PROCESSING MODULE

(75) Inventor: Michael T. Parker, Camarillo, CA (US)

(73) Assignee: Telect, Inc., Liberty Lake, WA (US)

(*) Notice: Subject to any disclaimer, the term of this patent is extended or adjusted under 35 U.S.C. 154(b) by 82 days.

(21) Appl. No.: 10/821,703

(22) Filed: Apr. 9, 2004

(65) Prior Publication Data

US 2004/0263182 A1    Dec. 30, 2004

Related U.S. Application Data

(60) Provisional application No. 60/462,250, filed on Apr. 11, 2003.

(51) Int. Cl.
*G01R 31/08* (2006.01)
*H01H 9/50* (2006.01)

(52) U.S. Cl. .......................... 324/536; 361/42

(58) Field of Classification Search ............... 324/536, 324/512, 500, 555, 424; 322/72, 73, 74; 361/42, 115, 601
See application file for complete search history.

(56) References Cited

U.S. PATENT DOCUMENTS

| | | | | |
|---|---|---|---|---|
| 4,466,071 A | * | 8/1984 | Russell, Jr. ................. | 700/293 |
| 5,452,223 A | * | 9/1995 | Zuercher et al. .............. | 702/58 |
| 5,485,093 A | * | 1/1996 | Russell et al. .............. | 324/522 |
| 5,561,605 A | | 10/1996 | Zuercher et al. ............ | 364/483 |
| 5,729,145 A | | 3/1998 | Blades ........................ | 324/536 |
| 6,522,509 B1 | * | 2/2003 | Engel et al. ................. | 361/42 |
| 2003/0030448 A1 | | 2/2003 | Sapir | |
| 2003/0227290 A1 | * | 12/2003 | Parker ........................ | 324/536 |

FOREIGN PATENT DOCUMENTS

EP        1126572 A        8/2001

* cited by examiner

*Primary Examiner*—Andrew H. Hirshfeld
*Assistant Examiner*—Hoai-An D. Nguyen
(74) *Attorney, Agent, or Firm*—Koppel, Patrick, Heybl & Dawson

(57) ABSTRACT

Methods and systems for reliable arc detecting in systems having power signals that experience decay or increase in amplitude. One embodiment of a system for detecting electrical arcs by monitoring an alternating current power supply comprises a sampling circuit which samples electrical signals. It further comprises a delay circuit which receives the sampling circuit output and stores a time history of the output over an interval including a past, present and future versions of the history. Causal/non-causal logic compares the present version with the past and future versions to determine which will be used as an arc monitoring version to compare the present version to for arc monitoring. A dynamic processing module compensates for any amplitude differences between the present version and the arc monitoring version. An arc monitoring circuit analyzes the present version and adjusted arc monitoring version to determine if an arc signal is present.

12 Claims, 27 Drawing Sheets

FIG. 32

141 Detect past, present and future cycles of a power supply signal

142 Compare a region from a present cycle of said signal to a similar region in said past cycle and in said future cycle and make a determination as to which the present cycle would correlate better with for arc monitoring

143 Adjust the amplitude of either said past or future cycles to adjust for amplitude decay or increase of said power supply signal

144 Subtract the present cycle from either said past or future cycle to form an arc signal artifact waveform

145 Analyze said arc signal artifact waveform to determine if an arcing condition exists

146 Let the amplitude adjusting comprise calculating an adjustment factor based on the averaging of at least a portion of said present cycle and the averaging of at least a portion of either said past or future cycles

147 Let the adjustment factor comprise a fraction having the averaging of said present cycle as the numerator and the averaging of either said past or future cycles as the denominator

148 Generate an alarm if said analyzing said arc signal artifact waveform determines that a dangerous arcing condition exists

ARC DETECTION METHOD UTILIZING A DYNAMIC PROCESSING MODULE

This application claims the benefit of provisional application Ser. No. 60/462,250 to Parker, which was filed on Apr. 11, 2003.

BACKGROUND OF THE INVENTION

1. Field of the Invention

This invention relates to arc detection in alternating current (AC) power systems.

2. Description of the Related Art

Electrical power systems often distribute power as an alternating current (AC) waveform, both for historical and engineering reasons. Although the standard 60 Hz frequency is commonly used by power utilities, other frequencies such as 400 Hz are also used, for example, in civilian and military aircraft.

Any electrical power system can be troubled by undesired electrical arcing, which can cause power failure, equipment destruction, and which in severe cases can even lead to fire or explosion. The problems of electrical arcing are particularly critical in aircraft, ships, around flammable fluids or in other environments in which human life depends on proper electrical functions. In these and other applications the reliable and early detection of electrical arcs is crucial.

Previous approaches to arc detection in AC power systems include monitoring the power waveform for wideband high frequency noise and examining the detected noise to find patterns of variation synchronized to the power waveform. See for example, U.S. Pat. No. 5,729,145 to Blades (1998); Blades includes a survey of prior art arc detection patents. High frequency noise monitoring methods do not allow the monitoring system to respond to frequency components of the arc signature, which may lie in the general frequency range of the AC fundamental. Furthermore, false alarms are not precluded by such methods, which still respond to harmonics of the AC fundamental, whether or not arc related.

Some previous methods (including that of the Blades U.S. Pat. No. 5,729,145) require that the spectrum of the arc signature be correlated to line frequency fundamentals. Such methods do not adequately detect more chaotic arc signatures, and they are plagued by false alarms related to transient load conditions, which are often well correlated to line frequencies.

An effective electric arc monitoring system should not only detect arc conditions, but should discriminate true arc signatures from power supply transients or other conditions that are not arc related. False alarms should be eliminated or limited to the greatest possible extent.

SUMMARY OF THE INVENTION

The present invention seeks to provide methods and apparatuses that can be used in conjunction with a causal/non-causal Electric Arc Monitoring System (EAMS), to help reduce or eliminate waveform artifacts that can result from a monitored signal with decaying or increasing amplitude. By reducing or eliminating these artifacts, false alarms during arc monitoring by the EAMS can also be reduced or eliminated.

An embodiment of a method according to the present invention for detecting arcing conditions in an alternating current power system having an AC power signal that is decaying or increasing in amplitude, comprises averaging the value of at least a portion of a first cycle of an AC power signal. The value of a similar portion of a second cycle of the AC power signal is averaged. An adjustment factor is calculated based on the averaging of the at least a portion of said first and second cycles, the adjustment factor having a value to compensate for changes in the amplitude between the first and second cycle portions. The adjustment factor is applied to the second cycle portion to form an adjusted second cycle portion. The first cycle portion is then compared to the adjusted second cycle portion to determine if there is an arcing signal on the AC power signal.

An embodiment for detecting electrical arcs in an electrical system having a power signal with a periodically alternating characteristic while reducing or preventing false alarms from decaying/increasing power signal amplitudes, comprises detecting past, present and future cycles of a power supply signal. A region from a present cycle of the signal is compared to a similar region in the past cycle and in the future cycle. A determination is made as to which the present cycle would correlate better with for arc monitoring. The amplitude of either the past or future cycles is adjusted to adjust for amplitude decay or increase of the power supply signal. The present cycle is subtracted from either the past or future cycle to form an arc signal artifact waveform. The arc signal artifact waveform is analyzed to determine if an arcing condition exists.

One embodiment of a system for detecting electrical arcs by monitoring an alternating current power supply comprises a sampling circuit which samples electrical signals. It further comprises a delay circuit which receives the sampling circuit output and stores a time history of the output over an interval including a past, present and future versions of the history. Causal/non-causal logic compares the present version with the past and future versions to determine which will be used as an arc monitoring version to compare the present version for arc monitoring. A dynamic processing module compensates for any amplitude differences between the present version and the arc monitoring version. An arc monitoring circuit analyzes the present version and adjusted arc monitoring version to determine if an arc signal is present.

These and other further features and advantages of the invention will be apparent to those skilled in the art from the following detailed description, taken together with the accompanying drawings, in which:

BRIEF DESCRIPTION OF THE DRAWINGS

FIG. 32 shows another embodiment of a method in accordance with the invention.

DETAILED DESCRIPTION OF THE INVENTION

The present application can be used in many different arc detection systems but is particularly applicable to causal or causal/non-causal type arc detection systems used in alternating current (AC) power systems. One of these systems is described in U.S. Patent Application Publication US 2003/0227290 A1, to Parker and assigned to the same assignee as the present application. The publication is incorporated by reference as though fully set forth herein. These systems can subtract a particular signal cycle from a cycle immediately before or after such that after the subtraction that remains can be the chaotic artifact arc signal. If the arc signal has a high enough amplitude, an arcing alarm can be sounded indicating an arcing condition.

In one embodiment of a causal/non-causal system according to the present invention assigns a past, present and future portion of the monitored waveform. The invention then compares the present value of the waveform both with (a) the past values at corresponding phases of the AC supply waveform, and (b) the future values at corresponding phases of the AC supply waveform. The monitored waveform is delayed or stored to allow such comparisons in near real time, to produce an output, which is only slightly delayed behind the monitored waveform.

More specifically, the system detects a signal from the electrical system which is indicative of a dynamic load characteristic of the system. A dynamic representation of the signal over at least two periods of the alternating characteristic is stored to obtain a representation of the time variation of the signal over those periods. A first value of the representation is compared with at least one past value and at least one value of the representation occurring after said first value. A detector output is produced based on the results of the comparison.

By comparing the present values of the monitored signal (typically current) with both earlier and later values, the invention simulates a non-causal signal processor but with a delayed output. This method achieves greater immunity to false alarms by better distinguishing chaotic signals, such as electrical arcs, from more causally predictable signals, such as expected loads.

Figure 1:
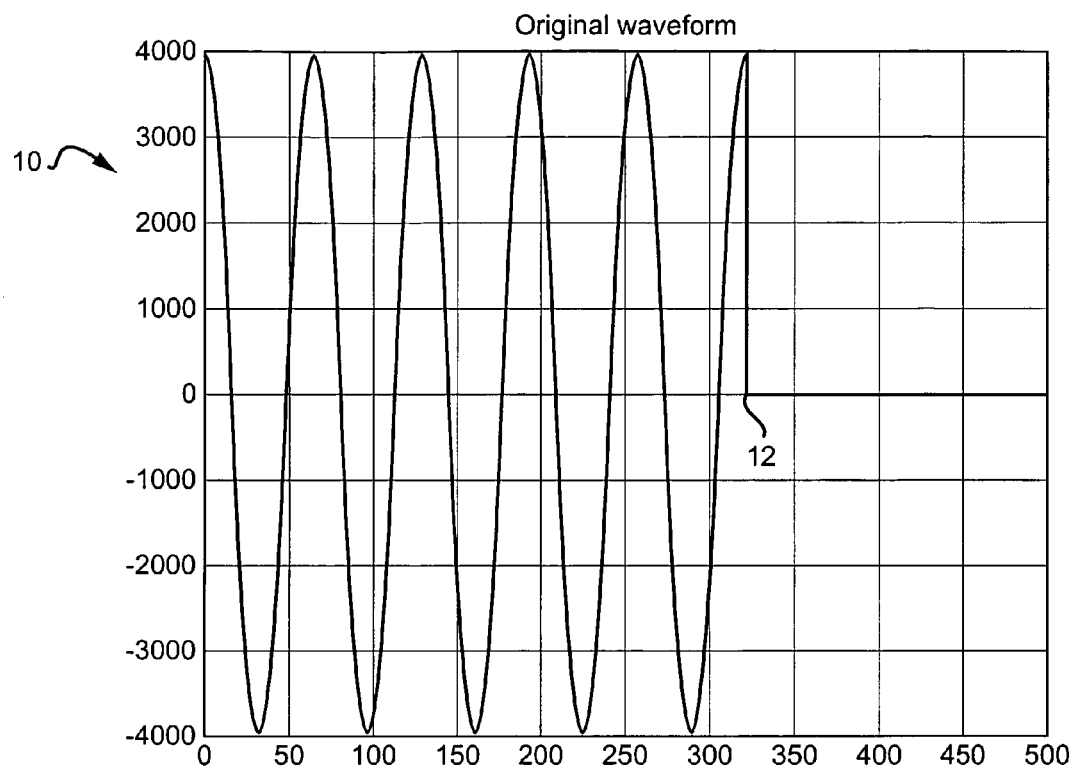
FIG. 1 is a waveform/signal showing a leading step-up to an alternating current signal.
Figure 2:
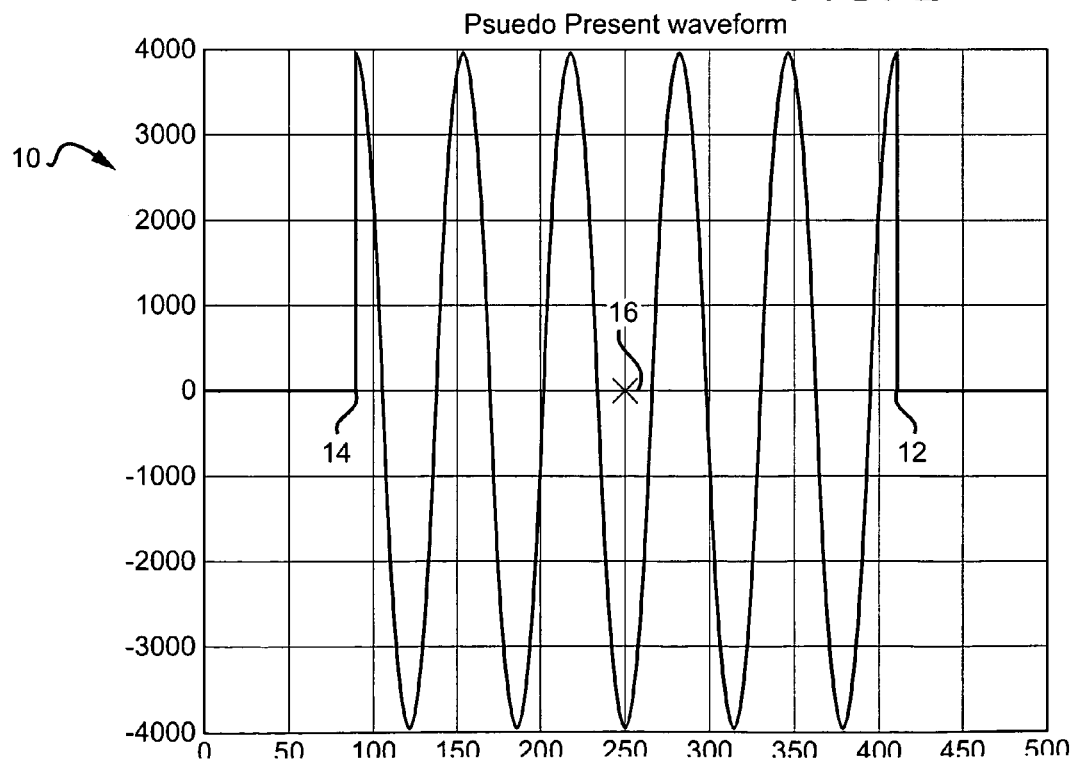
FIG. 2, shows the waveform/signal of FIG. 1, later in time and showing the leading step-up and trailing step-down.

FIGS. 1–4 show how a causal/non-causal Electric Arc Monitoring System (EAMS) conducts an analysis of an AC waveform 10 to avoid a false arcing alarm. The waveform 10 moves from left to right, and as shown the leading edge 12 (step up) of the waveform 10 is at approximately 320 of the x-axis and the trailing edge (step down) is at 0 of the x-axis. FIG. 2 shows the same waveform 10 with the leading edge 12 at 410 and the trailing edge 14 at 90, which shows the past/present/future designation as determined by the circuitry of the causal/non-causal Electric Arc Monitoring System. A leading edge point 12 of the signal is considered the future, a midpoint 16 is considered the present and the trailing edge point 14 is considered the past.

Figure 3:
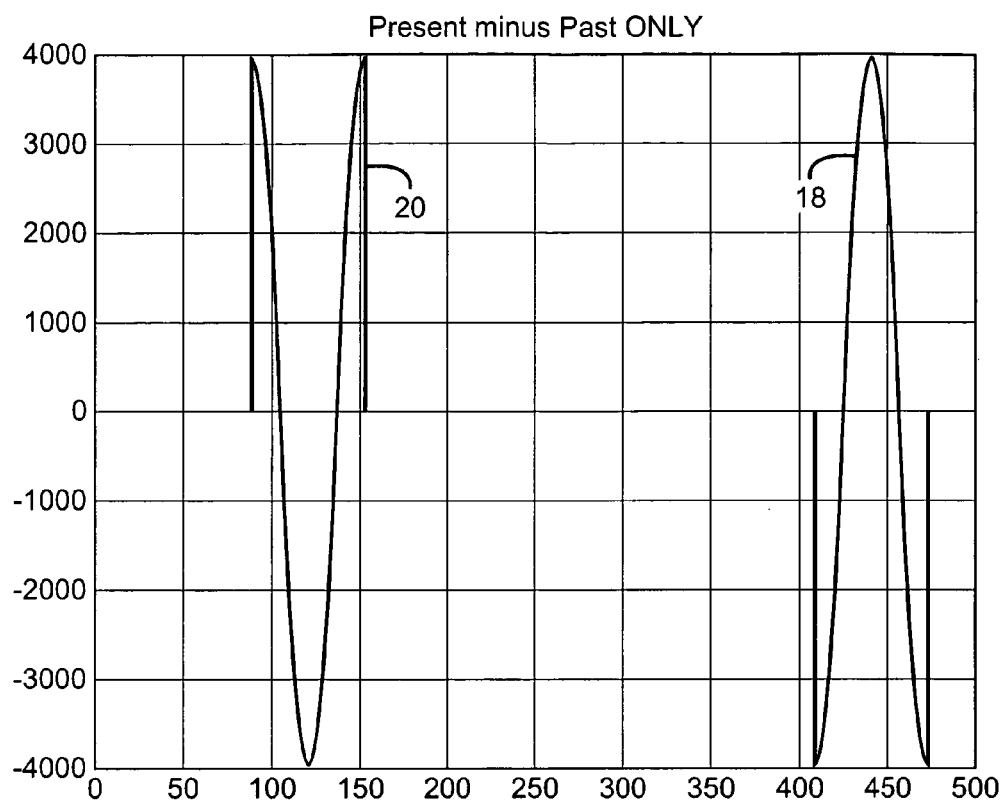
FIG. 3 shows the resulting artifacts when subtracting the cycles from one another in the waveform/signal of FIG. 2.

FIG. 3 shows the output waveform 20 of an EAMS that utilizes only the present minus past for determining whether an arcing condition has occurred. In the present minus past calculation, the zero line at the leading edge 12 of the waveform shown in FIG. 2 is subtracted from the corresponding cycle of waveform 10 immediately after the leading edge 12. This results in the first signal boundary artifact 22 shown in FIG. 3. Similarly, at the trailing edge 14 of the waveform 10 shown in FIG. 2, the signal cycle just before the trailing edge is subtracted from the zero after the trailing edge, which results in the signal boundary artifact 20. Without a causal/non-causal choice between present minus past or present minus future, the signal boundary artifacts 18, 20 remain that could result in a false arcing condition alarm.

Figure 4:
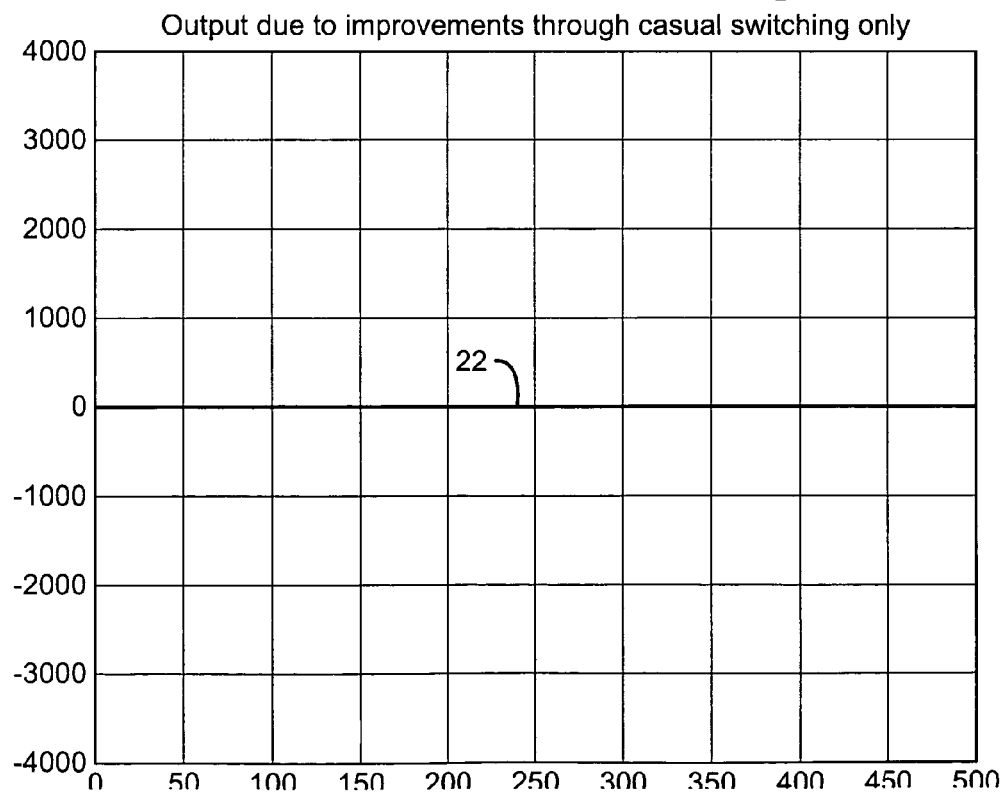
FIG. 4 shows the resulting waveform/signal when causal/non-causal logic is applied when subtracting the cycles from one another in the waveform/signal of FIG. 2.

FIG. 4 shows the improvements through causal/non-causal switching, which allows the EAMS to choose the best result between past/present or present/future for arc detection purposes. This results in a zero waveform 30 that removes the false alarm artifacts 22, 24 of FIG. 3.

Figure 5:
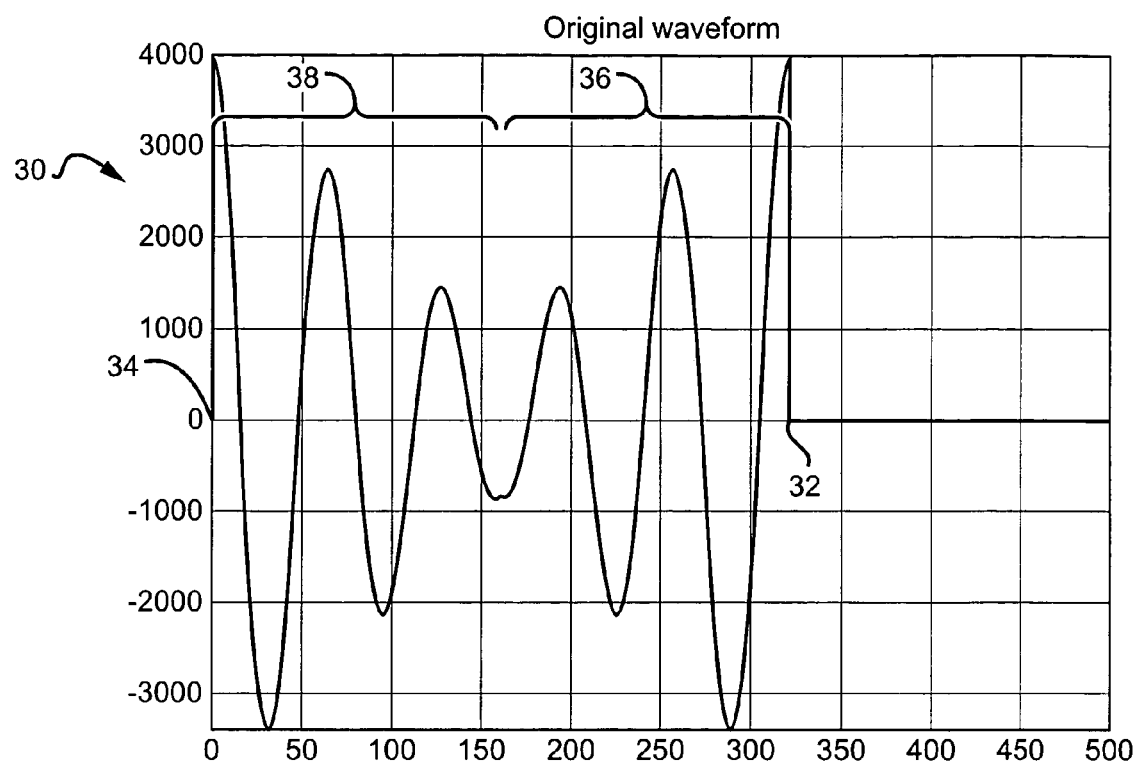
FIG. 5 is a waveform/signal showing a leading step-up and trailing step-down and having a decaying/increasing amplitude.

Other waveform conditions exist however, where the causal/non-causal approach does not adequately remove the signal artifacts that can lead to false arcing alarms. FIG. 5 shows one such waveform 30 that comprises a step up 32 at its leading edge and a step down at its trailing edge 34.

Figure 6:
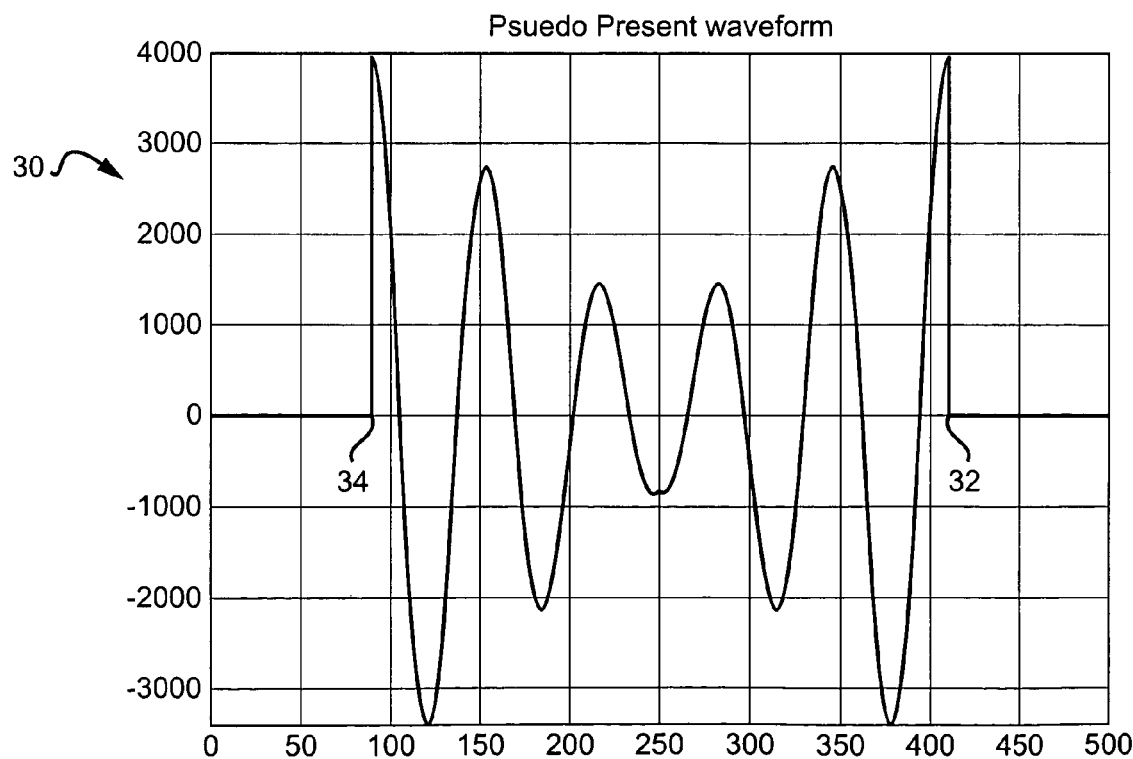
FIG. 6 shows the waveform/signal in FIG. 5 later in time.
Figure 7:
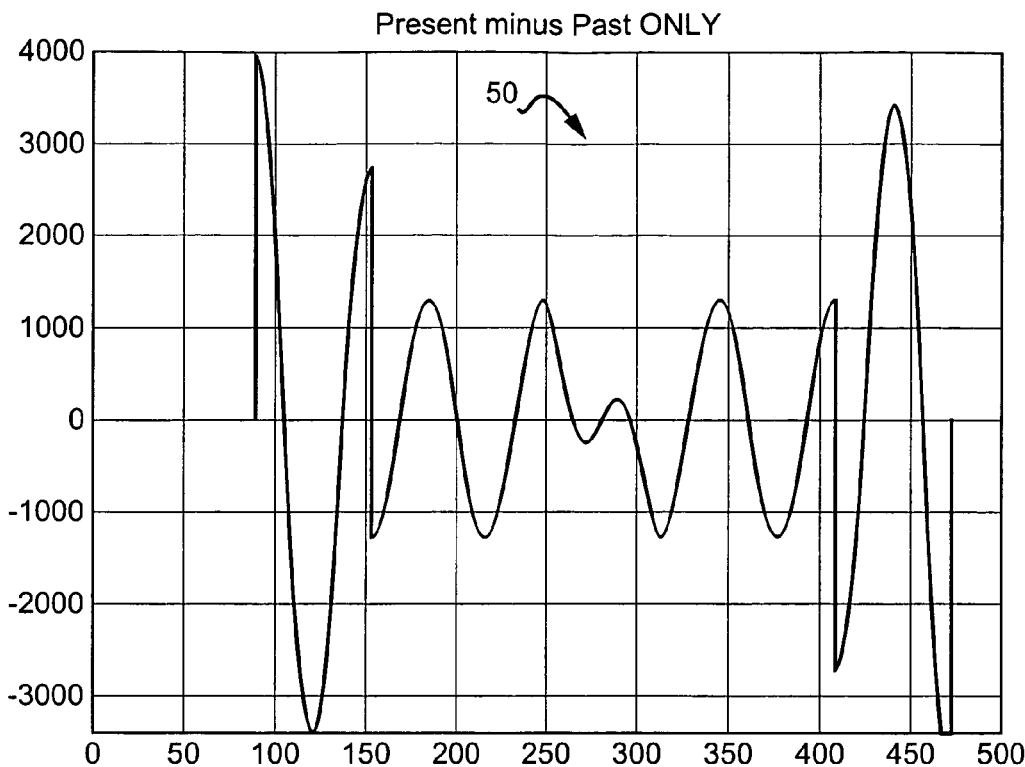
FIG. 7 shows the resulting artifacts when subtracting the cycles from one another in the waveform/signal of FIG. 6.
Figure 8:
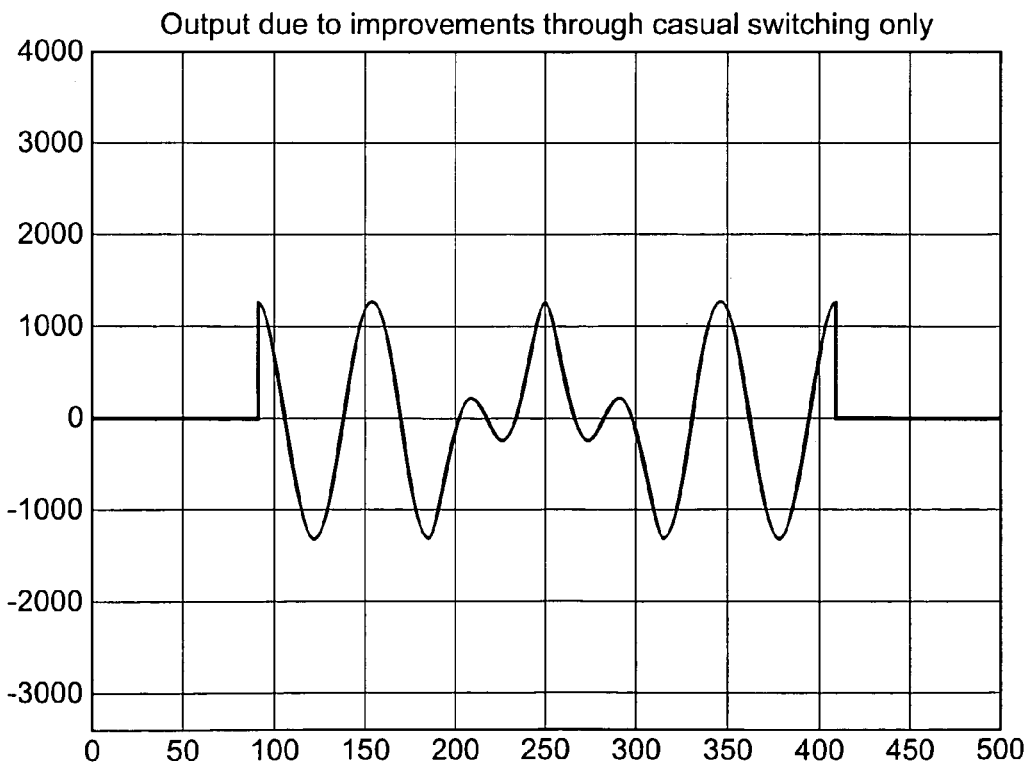
FIG. 8 shows the resulting waveform/signal when causal/non-causal logic is applied when subtracting the cycles from one another in the waveform/signal of FIG. 6.

Through its first half 36, the waveform decays in amplitude and during its second half 38, it increases in amplitude. FIG. 6 shows the waveform 30 after the Electric Arc Monitoring System circuitry has determined the leading edge 32 to be the past, the trailing edge 34 to be the future, and midpoint 40 to the present. FIG. 7 shows the resulting waveform 50 from the present minus past calculation. The resulting waveform 50 has artifacts throughout that could result in a false arcing alarm. FIG. 8 shows the waveform 60 after the causal/non-causal determination has been made, which results in an improved waveform. However, waveform conditions still remain that could result in a false alarm.

According to the present invention, an improved arc monitoring system compensates for the decaying and increasing signal amplitudes such that most false alarms can be avoided. FIGS. 9–27 show how one embodiment of a system/method according to the present invention compensates for decay/increase in signal amplitude while still conducting a causal/non-causal determination. In the embodiment shown, a number a points are sampled along the waveform and by utilizing a Dynamic Processing Module (DPM) the points are analyzed and manipulated to compensate for AC signals having decaying or increasing amplitudes, while at the same time allowing the EAMS to make its causal/non-causal determination. When the EAMS with a DPM makes a decision as to whether to use the present/past or present/future, the DPM calculates a DPM factor which is based on the average of a portion of the present cycle of the waveform and the average of a portion of the past or future corresponding waveform as the case may be. This DPM factor is then used to alter the past or future point to compensate for any signal amplitude decay or increase. This effectively averages out the amplitude decay or increase over the entire waveform, which reduces the amplitude of the artifacts that could lead to false arc alarms.

Figure 9:
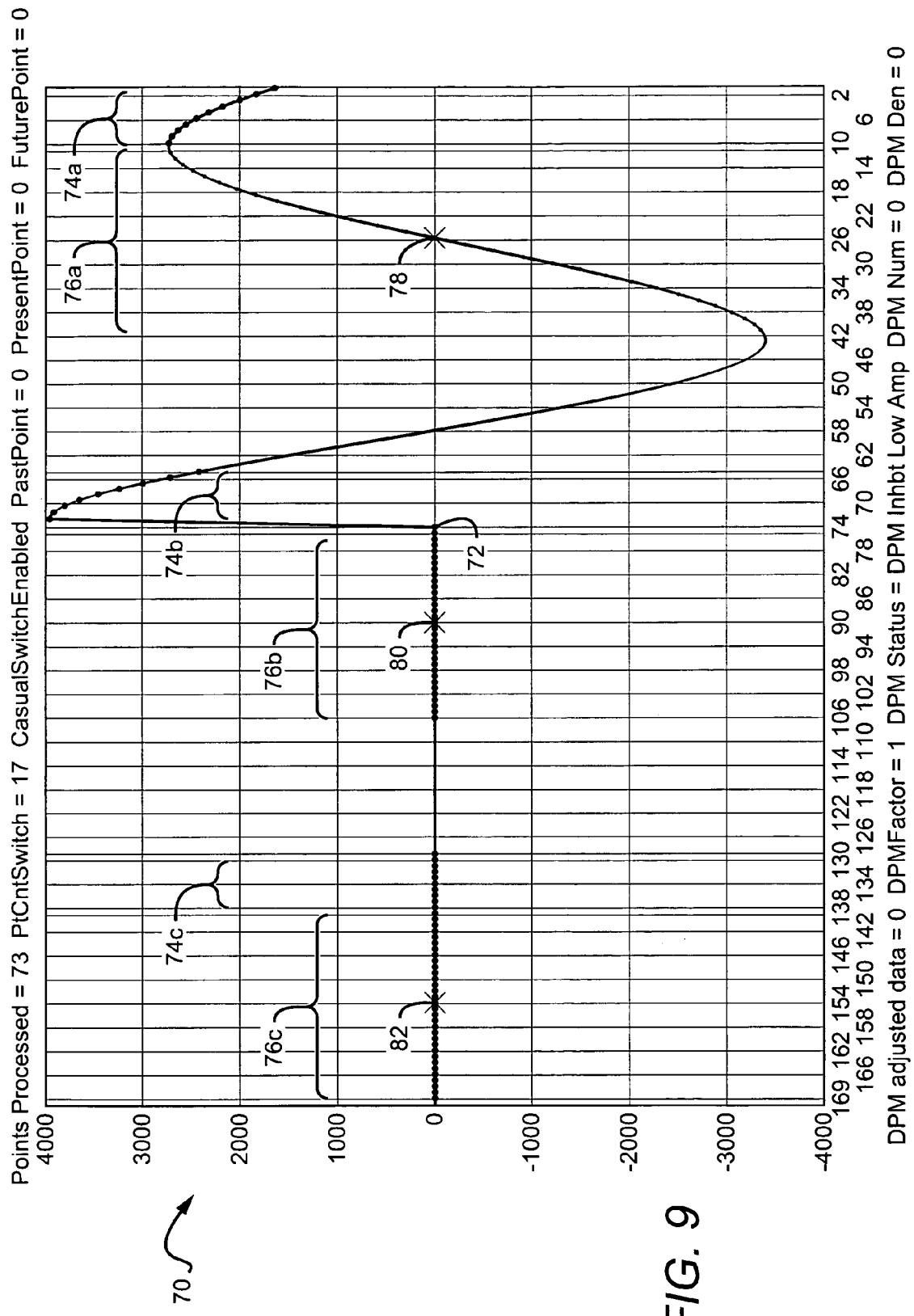
FIG. 9 is a waveform showing one embodiment of the regions and points on a waveform/signal used by one embodiment of a EAMS and DPM according to the present invention.

FIG. 9 shows a waveform 70 moving from right to left and having a leading edge 72. The waveform is divided up into regions by the EAMS and the DPM to allow for both the causal/non-causal determination and the compensation for decay/increasing in amplitude. Regions 74a, 74b and 74c of the waveform 70 are used by the EAMS to decide whether to use the past or future for the causal/noncausal determination. Regions 76a, 76b and 76c are used by the DPM module to generate a DPM factor which is then used to compensate for decaying or increasing signal amplitude. Region 76a has a data point 78 that is considered the future for EAMS, and regions 76b and 76c have the present and past points 80, 82. The different regions of waveform 70 can vary in length and can have more or fewer numbers of reference data points. They can also overlap or include a gap between adjacent regions. However, in the preferred embodiment, the regions do not touch or overlap, which makes the DPM calculations less complex.

FIG. 9 shows a number of data points along the top of the waveform 70 that include various measurements relevant to the causal/non-causal and DPM calculations. The data points are calculated by the EAMS and DPM while monitoring the points on the waveform 70. The "Points Processed" data shows the number of causal/non-causal data points processed by the EAMS for the particular waveform to determine whether to use the present/past or present/future for arc detection. The "PtCntSwitch" data shows the number of points that have passed since a decision has been made by the EAMS regarding a causal switch. A "CausalSwitch-Enabled" indication is also included that shows when the causal switch circuitry is enabled which allows the EAMS to make a switch. This indicator will change to "CausalSwitchLockedOut" after a causal switch has been made, which essentially disables the causal switch circuitry. This is done so that the system is not continually making a causal switch. This allows the system to change only on the grading/increasing amplitude signals, instead of more sudden arc condition signals. Decaying of a signal happens over multiple cycles and the causal switches are typically locked out for less than a half cycle. Data is also included for the "PastPoint", "PresentPoint" and "FuturePoint", which correspond to the amplitude of the waveform at the past, present and future data points 82, 80, 78, respectively (all of which are zero in this case).

The bottom of FIG. 9 also shows values calculated by the DPM that are used for decay/increasing compensation. The "DPM Num" and "DPM Den" are used by the DPM as the numerator and denominator of the "DPMFactor", which is also shown at the bottom of the graph. In this case the DPM module is manipulating the data points in the past region 76c compared to the data points in the present region 76b. The DPM Num is the average of the data points in the present waveform section 76b (in this case zero) and the DPM Den is average of the data points in the past waveform section 76c (also zero). With both the DPM Num and DPM Den being zero, the DPMFactor is one. The "DPM adjusted data" is also shown, which is the adjusted value of a point in the waveform based on the value of the DPMFactor. In this case it would be an adjustment to a point in the past section 76c of the waveform, based on decay or increase of the waveform between the present 76b and the past 76c. In this case, all the points in the past section 76c are zero and the DPM factor is one, which results in the DPM adjusted data also being zero.

The points shown region 74b are considered the present for causal/noncausal calculation purposes and this region is compared to the past and future regions 74c, 74a regions for switching determination. Region 74b has nine "present" data points, and as shown, the points correlate better to (i.e. are closer in value to) the future points in region 74a compared to the past points in region 76c. Based on this determination of better correlation, the EAMS decides to switch from the using the past/present for arc monitoring, to using the future/present. As shown in the following, the EAMS and the DPM count down to the appropriate point to make the switch, while at the same time compensating for any amplitude decay and increase.

Figure 10:
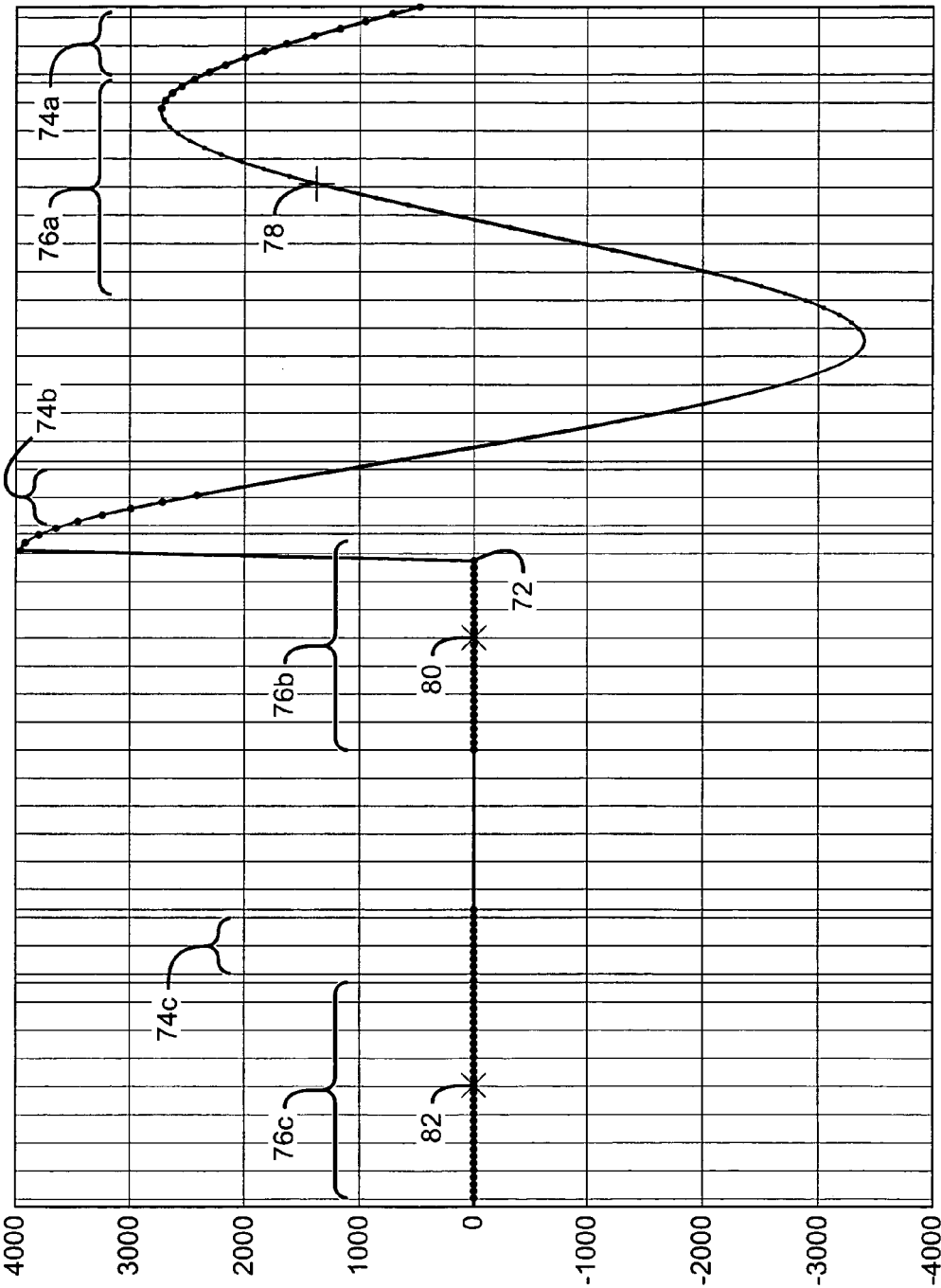
FIG. 10 shows the waveform of FIG. 9, five data points later in time.

FIG. 10 shows the waveform 70 from FIG. 9, five data points later in time. The Point Processed now indicates 78 and the PtCntSwitch in now down to 12 (previously 17). When the PtCntSwitch reaches zero, a causal switch will take place. Because the decision has been made to make causal switch, the CausalSwitch indicates that it is now locked out to prevent another immediate causal switch.

The bottom of the waveform 70 shows the "DPM Status" shows "Num (Prsnt) frozen from c switch." This locks the DPM Num to its value just prior to the decision to make the causal switch. This prevents the corruption of the DPM Num (and resulting corruption of the DPM factor) that would result from the step up at the leading edge 72 of the waveform 70 as enters present region 76b in the time points that follow. This prevents an erroneous DPM Factor from being used to change the value of the past region 76c between the time that the decision has been made to switch to the future/present and the time that the step up reaches the present point 80.

Figure 11:
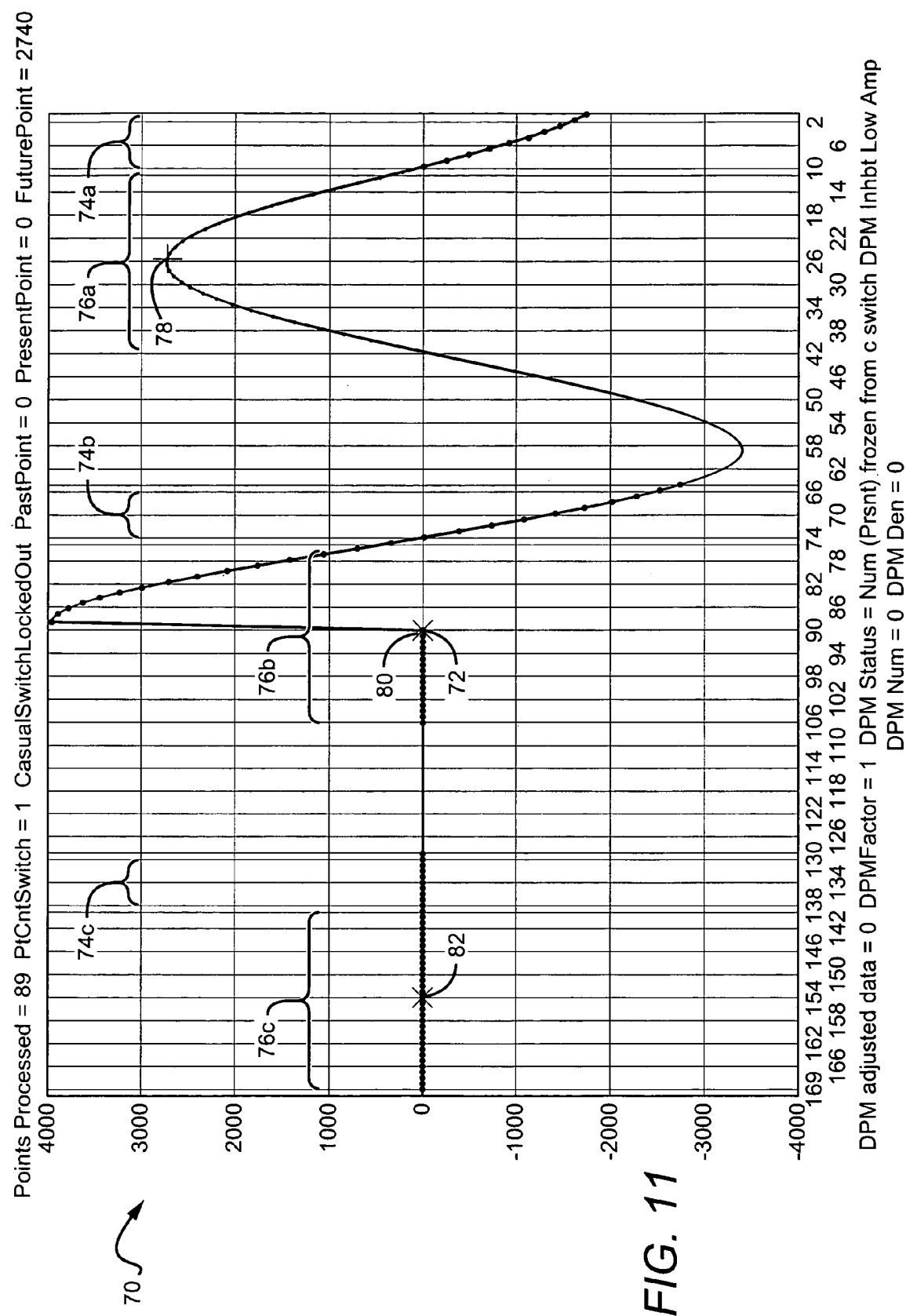
FIG. 11 shows the waveform of FIG. 10, 11 data points later in time.

FIG. 11 shows the waveform 70 from FIG. 10 eleven data points later in time with the Points Processed at 89 and the PtCntSwitch down to 1. After one more data point passes, the causal switch will be made and the EAMS will switch to the future/present comparison for arc monitoring. The DPM Status is still frozen because the switch has not yet been made. In one embodiment of the invention the DPM will remain frozen until the leading edge 72 proceeds through the entire present region 76*b* to prevent the leading edge 72 from corrupting any data even after the causal switch has been made. In another embodiment that protects against data corruption, the span and center of the present region 76*b* can be adjusted by the DPM to eliminate the corruption.

Figure 12:
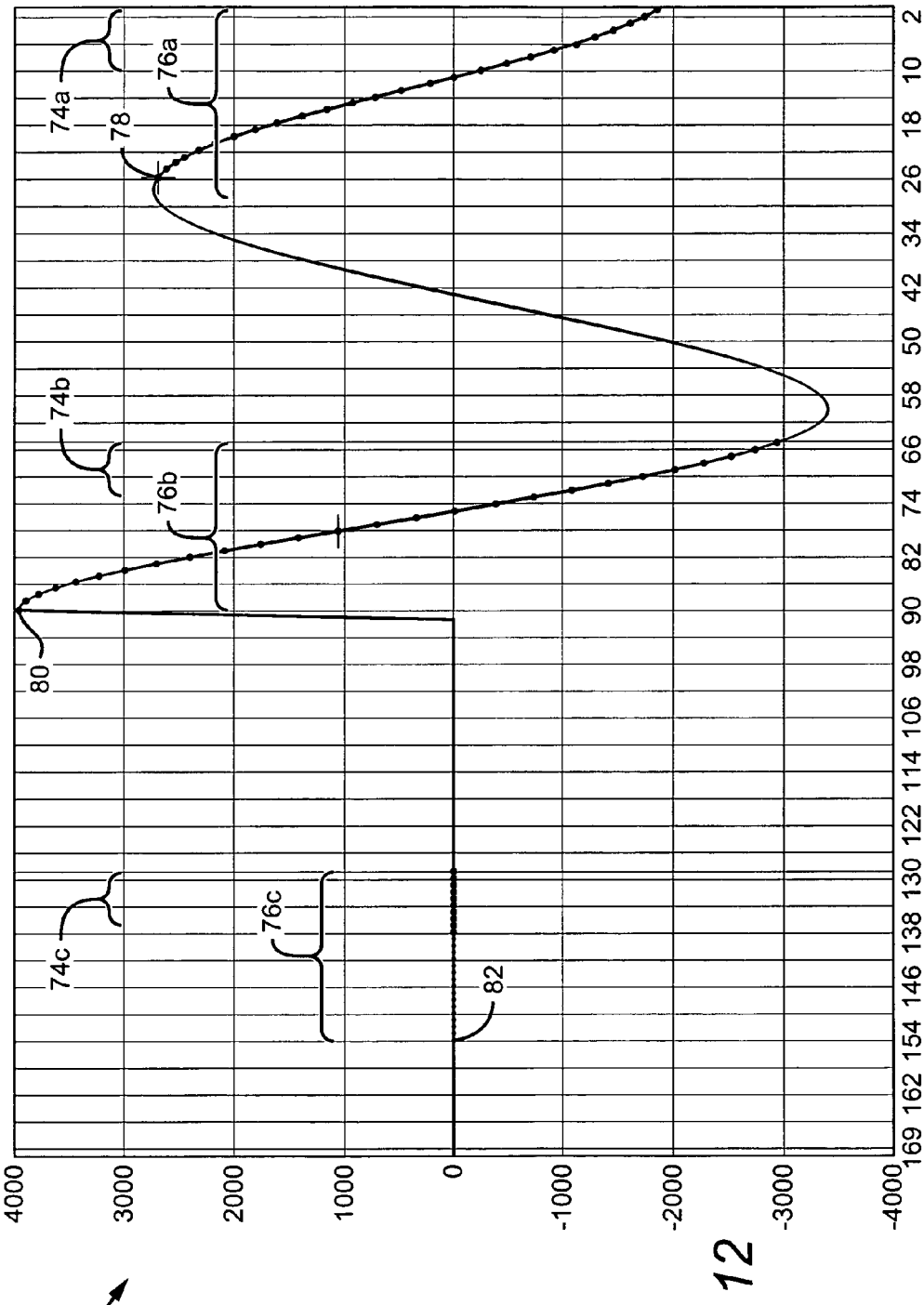
FIG. 12 shows the waveform of FIG. 11, one data point later in time.

FIG. 12 shows one embodiment according to the present invention of how the DPM adjusts the span and center and shows the waveform 70 just after the switch to the future/present comparison for arc monitoring. The present and the future regions 76*b* and 76*a* are now relied upon for arc monitoring and the DPM Module adjusts the future data points compared to the present data points using the DPM factor. However, instead of relying on the same time frame for the past, present and future regions 76*c*, 76*b*, 76*a*, the DPM and/or EAMS adjusts these regions to the right and utilizes the data points from the causal determination regions 74*c*, 74*b*, 74*a* for the DPM calculations of regions 76*c*, 76*b*, 76*a*, respectively. The data points from regions 74*c*, 74*b*, 74*a*, are not needed for causal determination because the causal switch has just been made and another causal switch will be locked out for a certain amount of time. With the causal switch locked out the DPM module can immediately use these data points for DPM determination. The typical DPM region 76*c*, 76*b*, 76*a* has 34 data points, but after this span and center adjustment, the regions have 26 data points. As the waveform moves forward in data points, the adjusted center of the DPM regions 76*c*, 76*b* and 76*a*, expands and eventually allows room for full DPM regions and causal data point regions.

Figure 13:
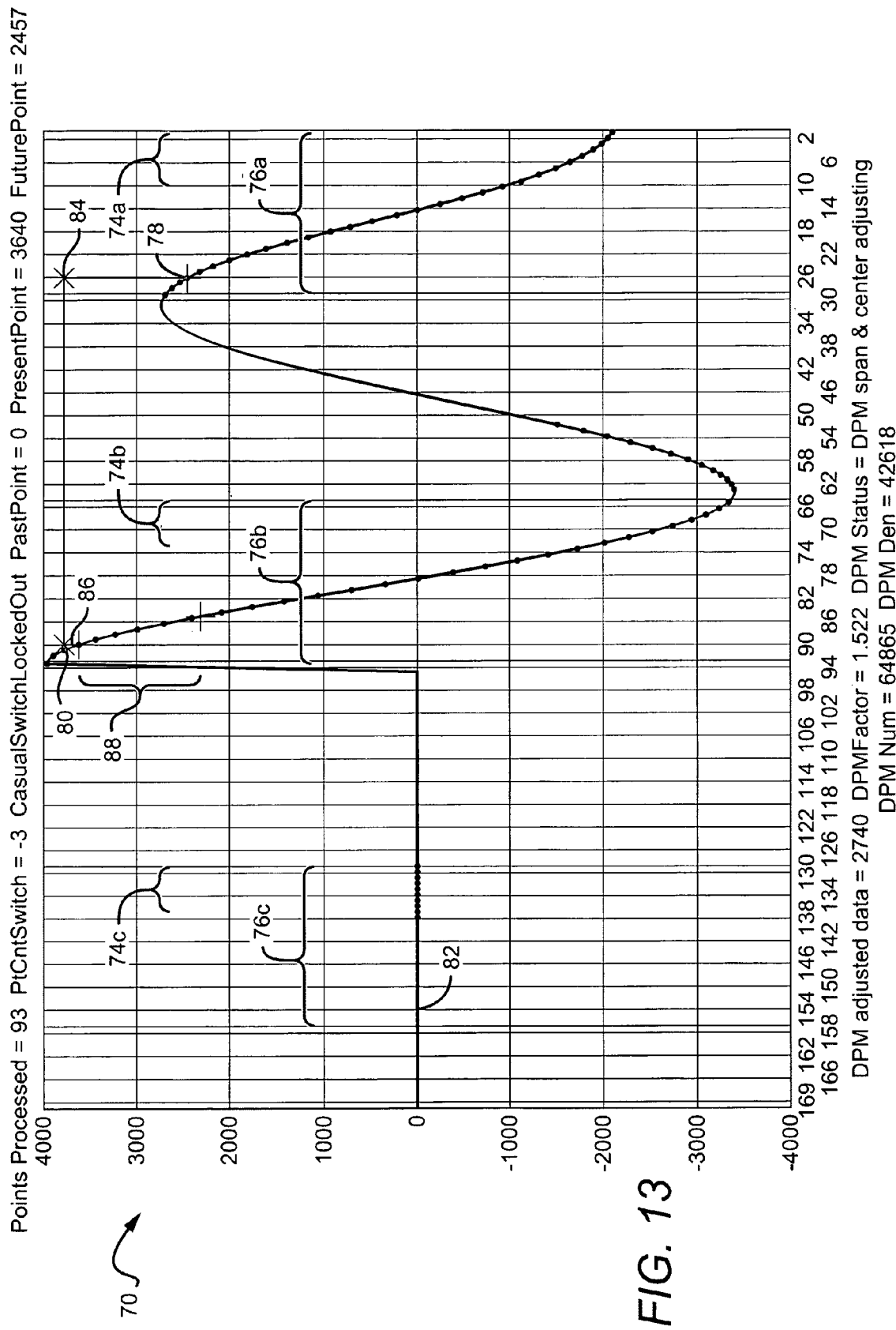
FIG. 13 shows the waveform of FIG. 12, three data points later in time.

FIG. 13 shows the waveform 70 of FIG. 12 after three data points in time have passed and shows that the DPM regions 76*c*, 76*b*, 76*a* are increased by the three data points. FIG. 13 also shows the DPM adjusted data at the bottom of the waveform having a value of 3740 and shown in the waveform 70 as adjusted future point 84, which equals the future point 78 (having a value of 2457) times the DPM Factor (1.522) which equals the DPM adjusted data point 12 (having a value of 3740). As described above, the DPM Factor is based on the DPM Num and the DPM Den. The arc monitoring system is now using the future/present, so the DPM Num is the average of the data points in the present region 76*b* and the DPM Dem is the average of the data points in the future region 76*a*. The future point 78 is 2457, which because of decay in the waveform 70 is much less than the present point 80, which is 3640. In causal/non-causal determination this could result in an artifact that could lead to a false arcing alarm. By adjusting the future point, the DPM compensates for the decay to avoid this artifact. The adjusted future point 84 is very close to the value of the present point 80. The waveform 70 shows the resulting DPM error margin 86 after DPM adjustment compared to the normal error margin 88 without the DPM adjustment.

Figure 14:
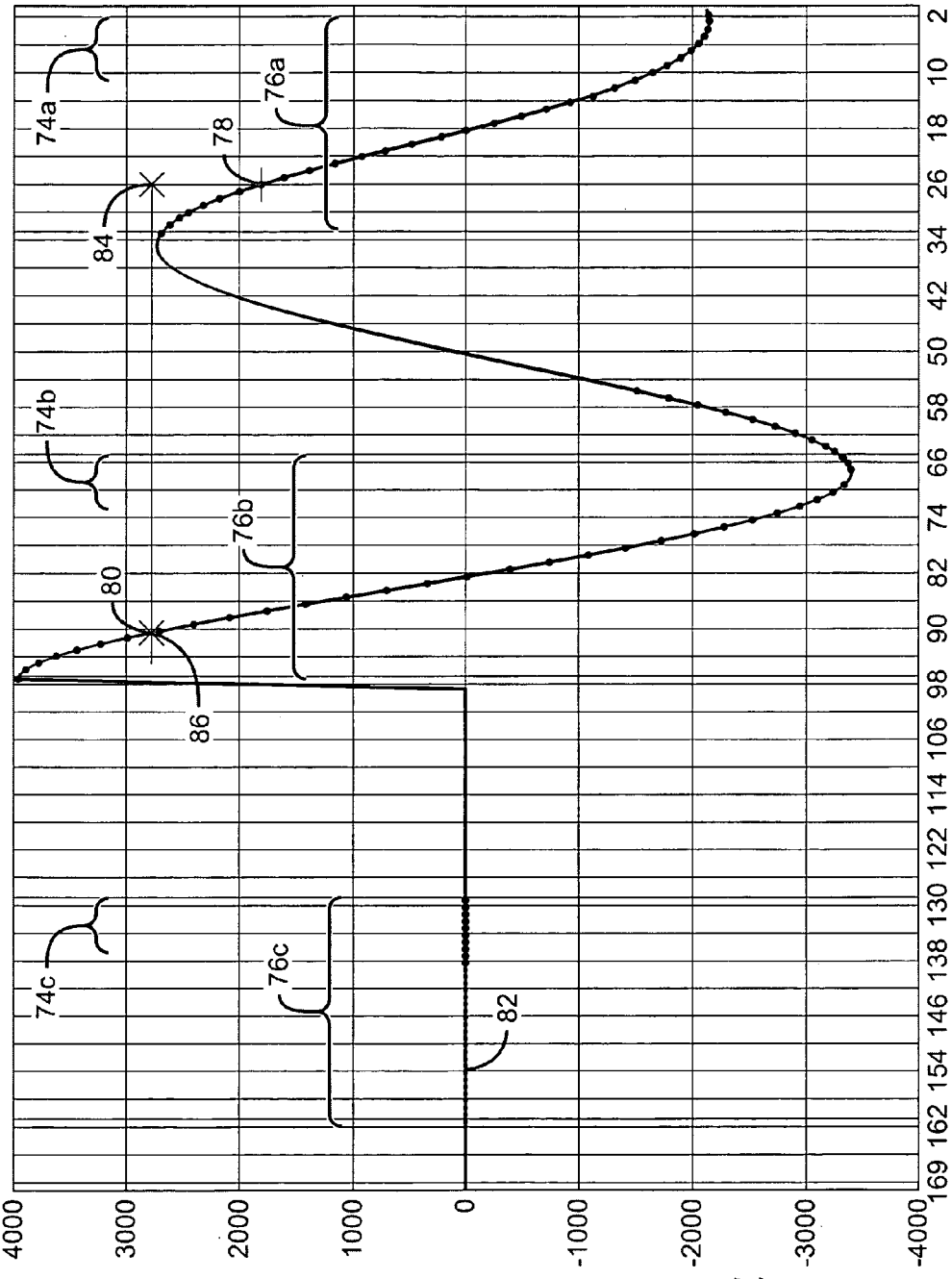
FIG. 14 shows the waveform of FIG. 13, four data points later in time.

FIG. 14 shows the waveform 70 in FIG. 13 four points later in time and again shows the DPM adjusted future point 84, which is calculated using a different DPM Factor (1.5326) that is the result of a different DPM Num and DPM Dem. The present point 80 is also shown with DPM adjusted error margin 86 between the present point 80 and the DPM adjusted future point 78, compared to the error margin without DPM adjustment 88 between the future point 78 and the present point 80. The waveform 70 has moved a sufficient number of data points in time so that the DPM regions 76*c*, 76*b*, 76*a* have expanded to their maximum number of points (34) and the next data point will be made available for causal/non-causal determination. Until the standard number of data points becomes available for the causal/non-causal regions 74*c*, 74*b*, 74*a*, the CausalSwitch remains locked out.

Figure 15:
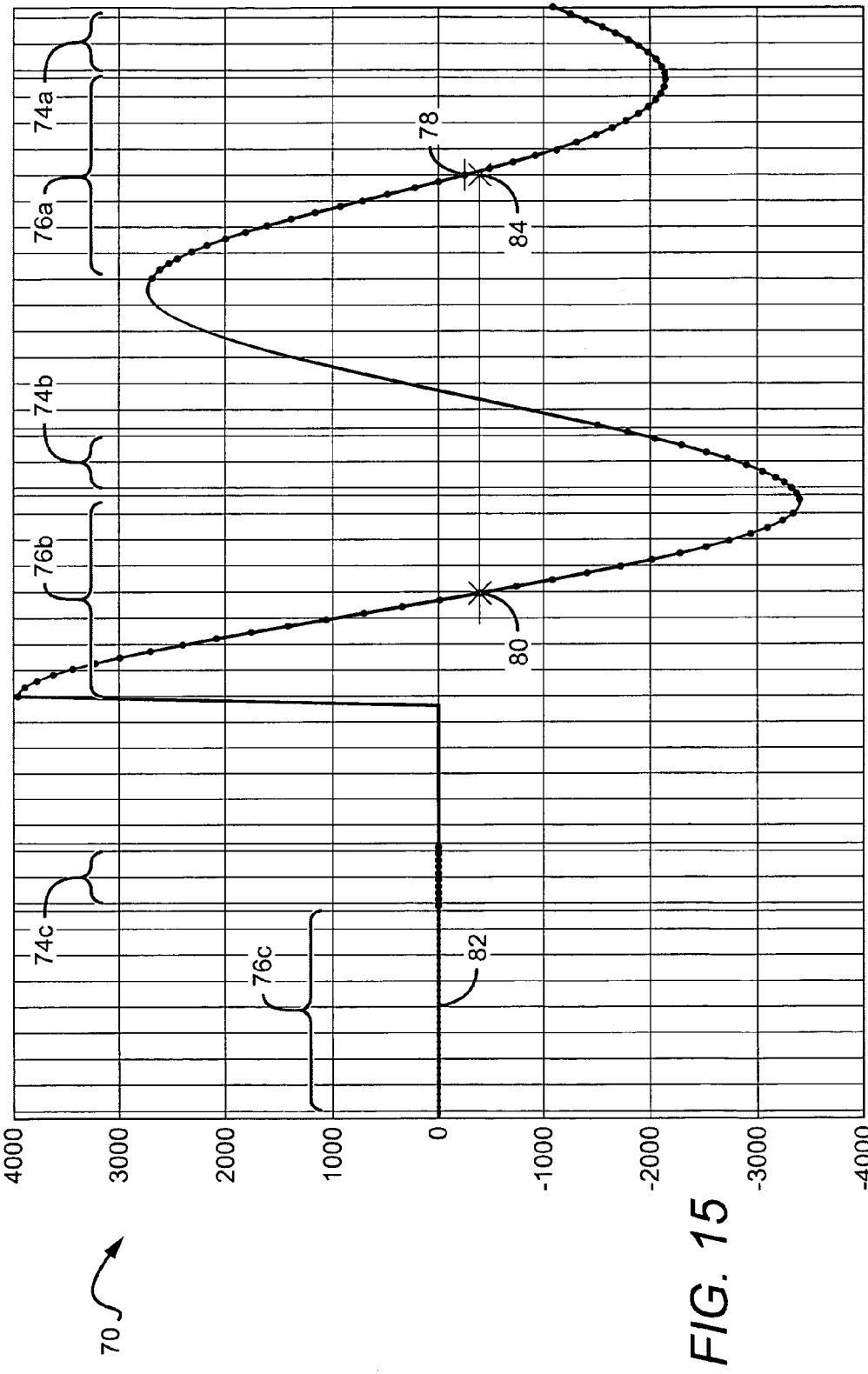
FIG. 15 shows the waveform of FIG. 14, nine data points later in time.
Figure 16:
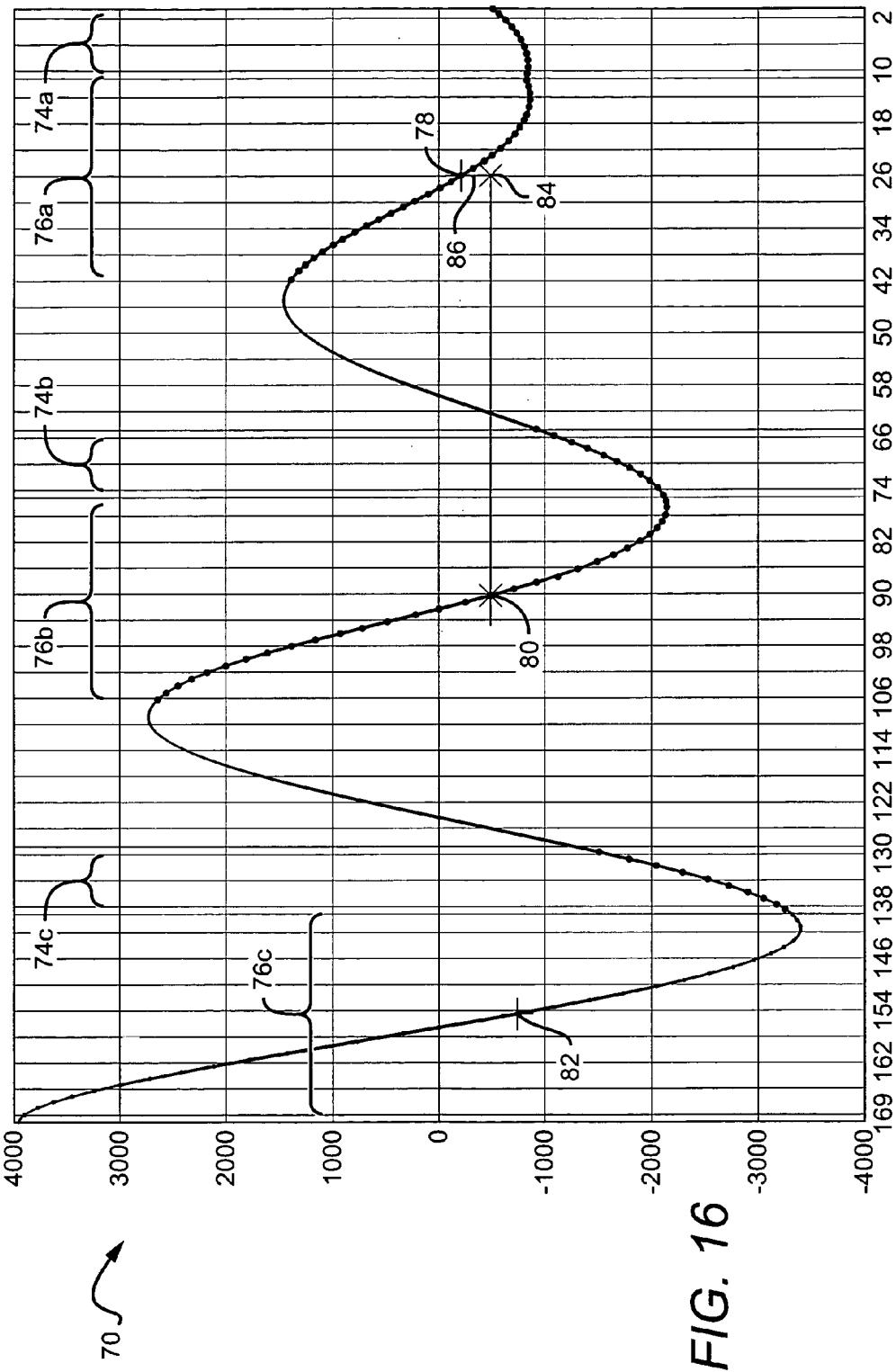
FIG. 16 shows the waveform of FIG. 15, 65 data points later in time.

FIG. 15 shows the waveform 70 of FIG. 14 nine data points later in time. The waveform 70 includes the present point 80 and the DPM adjusted future point 84. At this point in time for the waveform 70 the causal data regions 74*c*, 74*b*, 74*a* and DPM data regions 76*a*, 76*b*, 76*a* are at their maximum number. FIG. 16 shows the waveform 70 of FIG. 15, approximately 65 points later in time with its present point 80 having a value of −464 and the future point 78 having a value of −214 due to decay in the waveform. The DPM Factor is 2.1699, which results in a DPM adjusted future point 84 having a value of −465.

Figure 17:
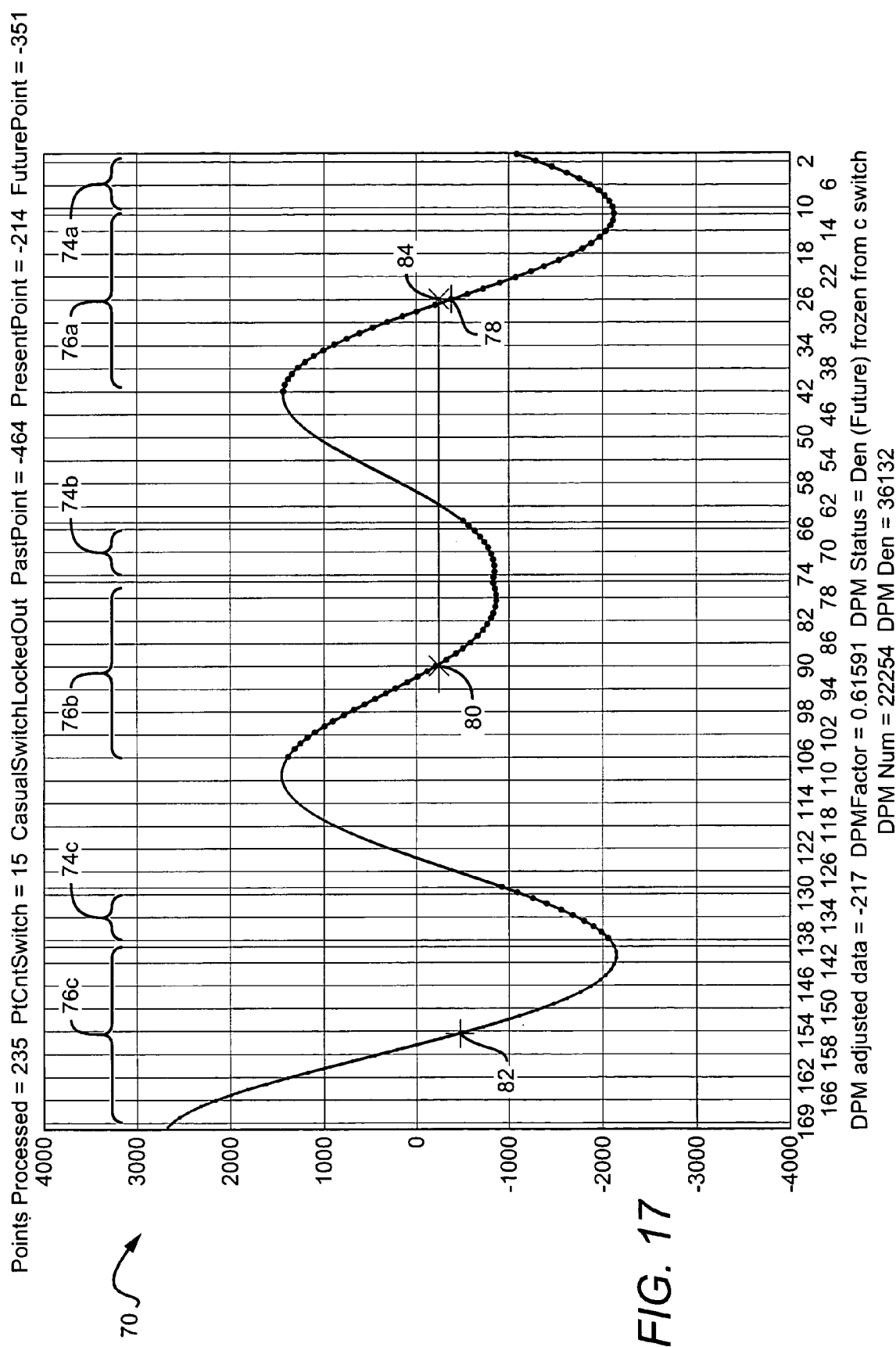
FIG. 17 shows the waveform of FIG. 16, 64 data points later in time.

FIG. 17 shows the waveform 70 of FIG. 16 64 points later in time. For arc monitoring purposes the data points in the present region 76*b* now have a better correlation to the data points in the past region 76*c*. Based on this correlation, the EAMS decides to switch to the present/past comparison for arc monitoring. The PtCntSwitch is at 15, which shows that the switch decision was made two data points before.

Figure 18:
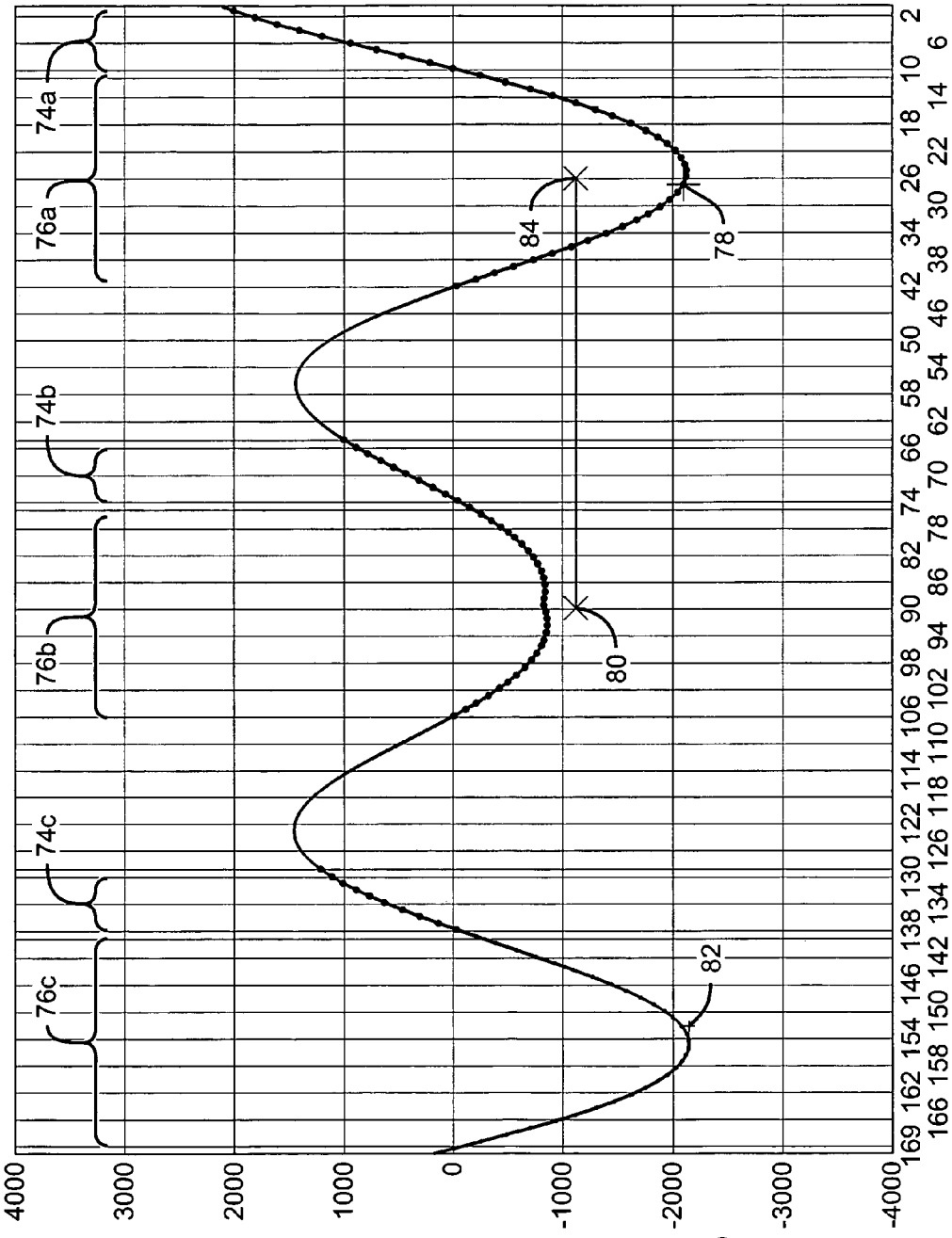
FIG. 18 shows the waveform of FIG. 17, 14 data points later in time.

FIG. 18 shows the waveform 70 of FIG. 16, 14 data points later in time and one data point before EAMS and DPM switch from the present/future to the present/past for causal determination and DPM adjustment. Under the DPM Status in FIGS. 17 and 18, indicates "Den (Future) frozen from c switch". This shows that the DPM Den is frozen based on the causal switch decision to prevent the DPM factor from being corrupted before the causal switch.

Figure 19:
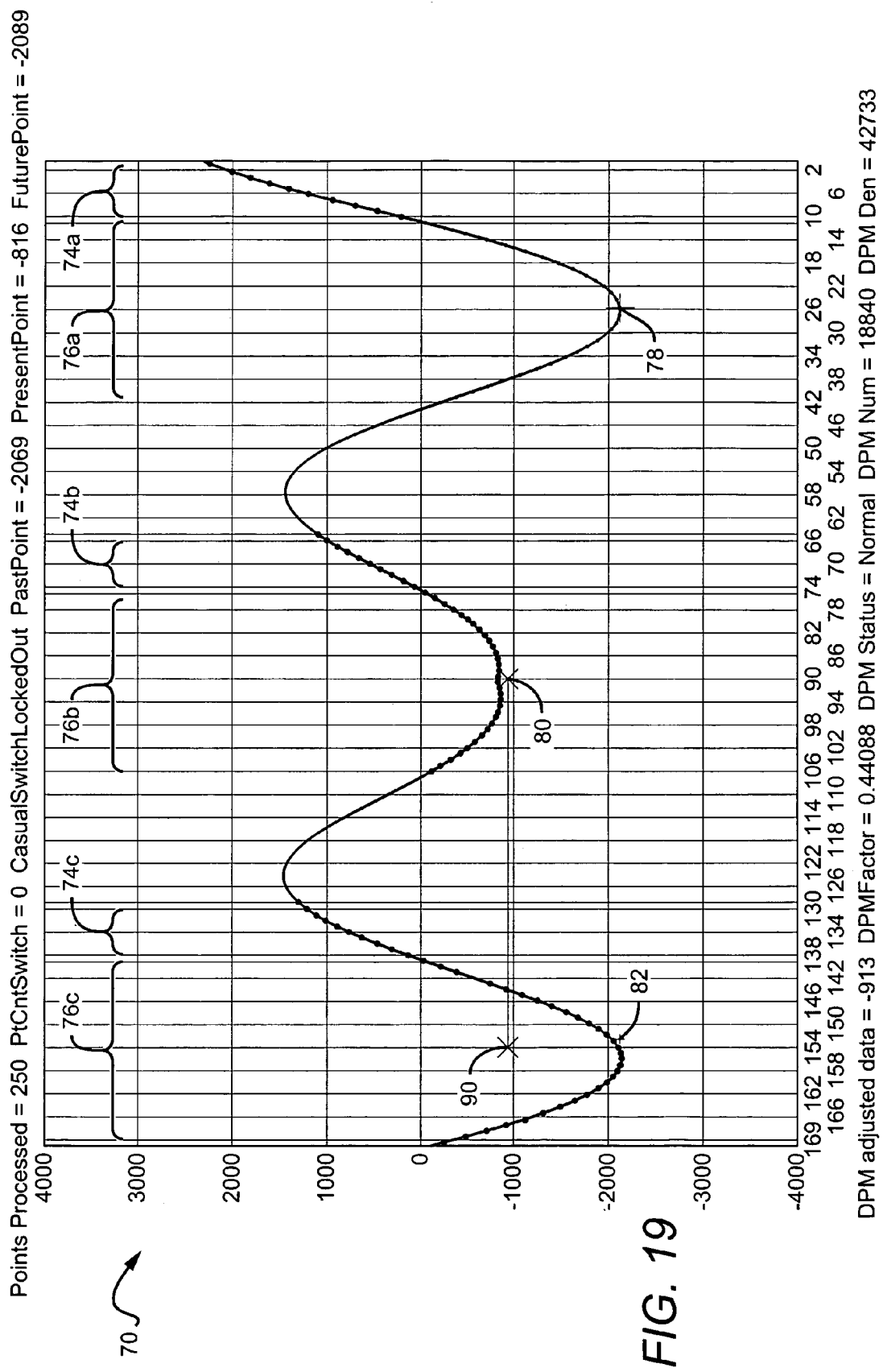
FIG. 19 shows the waveform of FIG. 18, one data point later in time.

FIG. 19 shows the waveform 70 of FIG. 18 one point later and after the causal/non-causal switch has been made to the present/past for arc monitoring and DPM adjustment. When switching from present/future to present/past the span or the center of the DPM regions 76*c*, 76*b*, 76*a* are not adjusted as described above to use the causal/non-causal regions 74*c*. 74*b*, 74*a* when switching from present/past to present/future. The system already has all of the past data necessary for DPM adjustment so the DMP Module does not need the data points from the causal/non-causal regions 74*c*, 74*b*, 74*a*. Enough data points are available to calculate the DPM Factor (0.44088), which is then used to change the past point 82 to the DPM adjusted past point 90.

Figure 20:
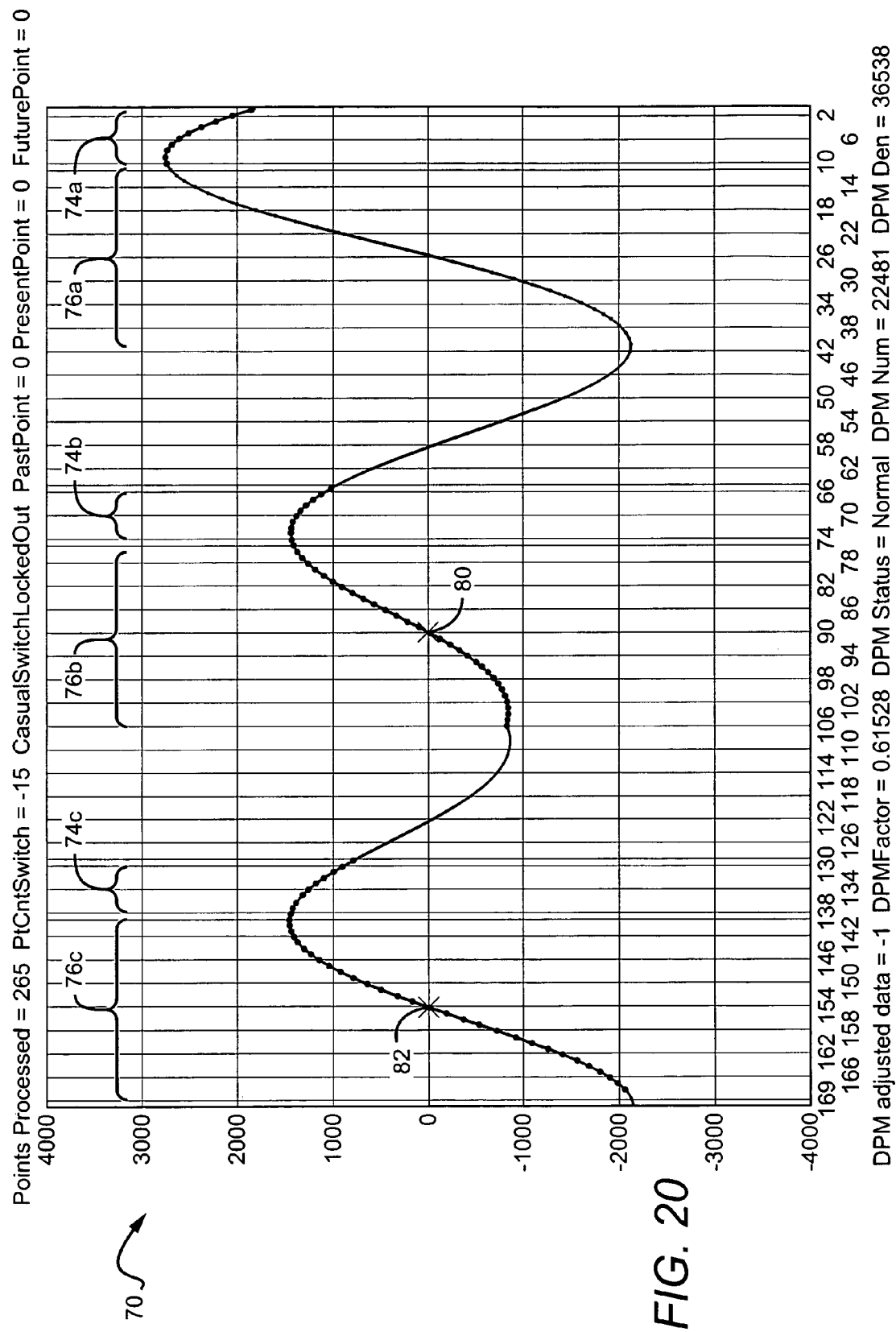
FIG. 20 shows the waveform of FIG. 19, 15 data points later in time.
Figure 21:
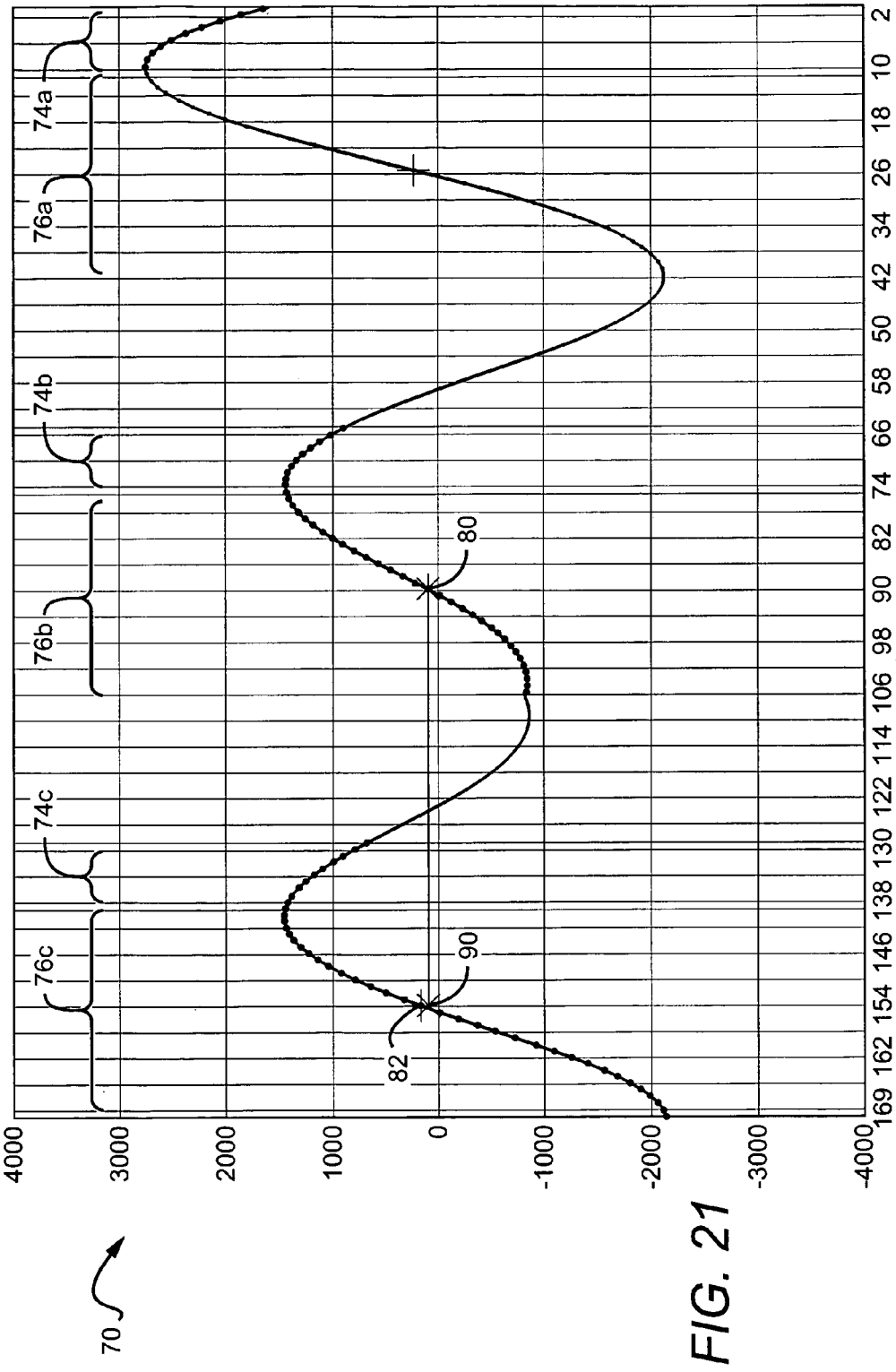
FIG. 21 shows the waveform of FIG. 20, one data point later in time.

FIG. 20 shows the same waveform 70 of FIG. 19, 15 data points later in later in time. FIG. 21 shows the waveform 70 of FIG. 20, 1 point later in time showing CausalSwitchEnabled, which allows the EAMS to again make its determination as to whether the present/past or present/future determination correlates better for arc monitoring and detection.

Figure 22:
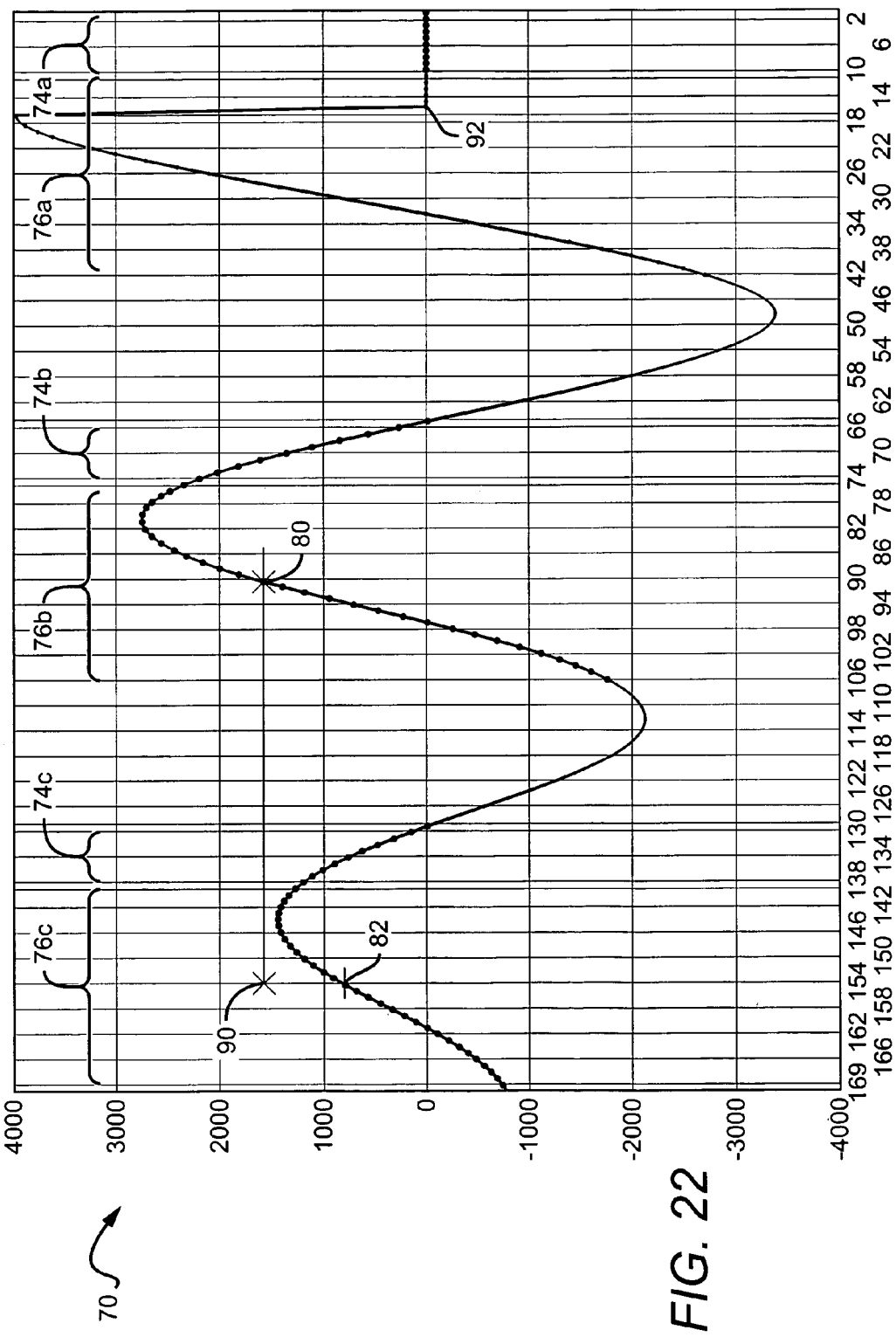
FIG. 22 shows the waveform of FIG. 21, 70 data points later in time.
Figure 23:
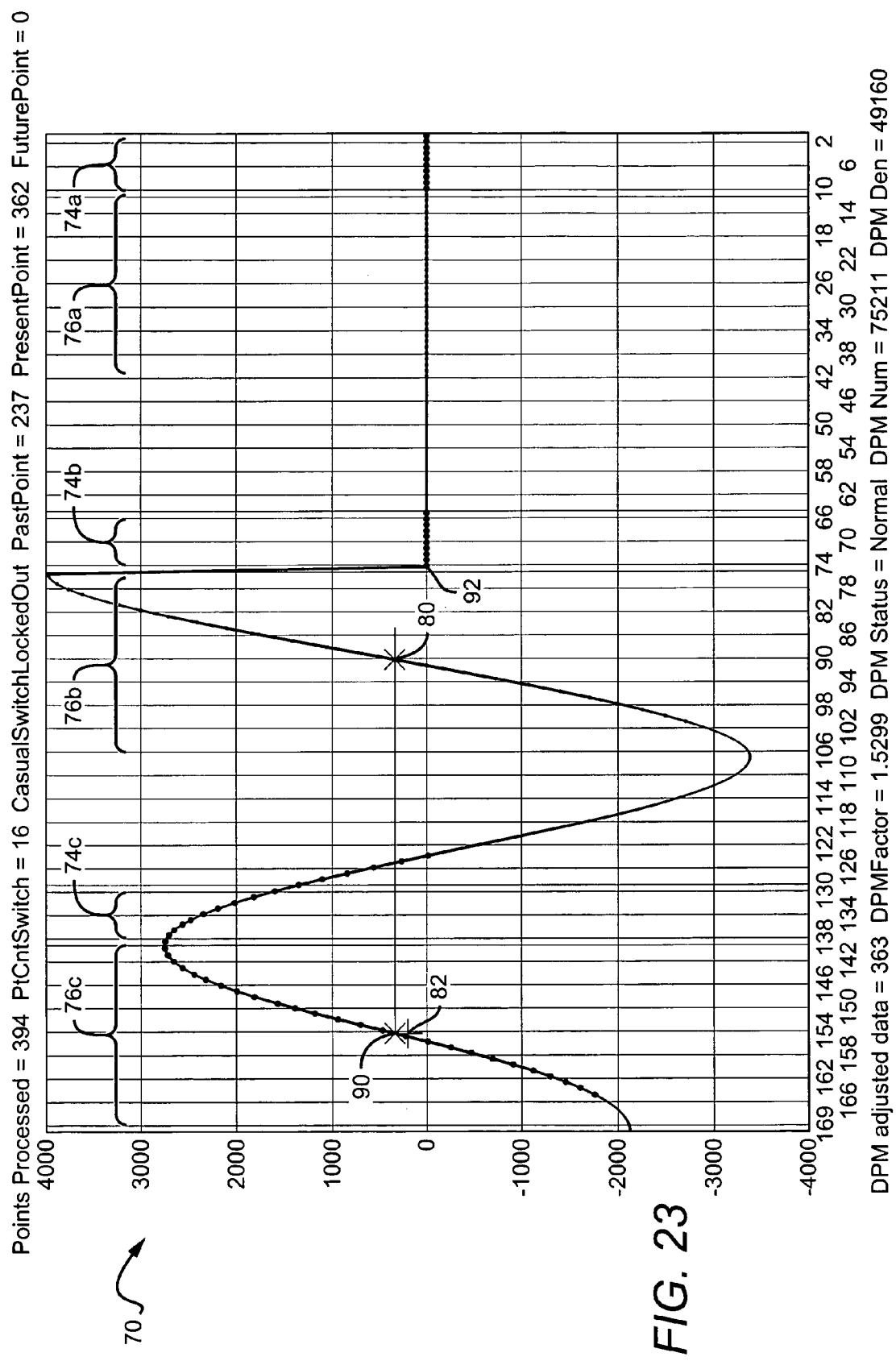
FIG. 23 shows the waveform of FIG. 22, 58 data points later in time.

FIG. 22 shows the waveform of FIG. 21, 70 data points later in time, with the waveform's trailing edge 92 entering in the future region 76*c*. FIG. 23 shows the waveform 70 of FIG. 22 58 points later in time, after the EAMS has determined that the present/future correlates better than the present/past and that a causal switch will be made. The waveform now shows CausalSwitchLockedOut which indicates that a causal switch determination is locked out. The PtCntSwitch is at 16, one point after the decision by the EAMS was made to make a causal switch.

Figure 24:
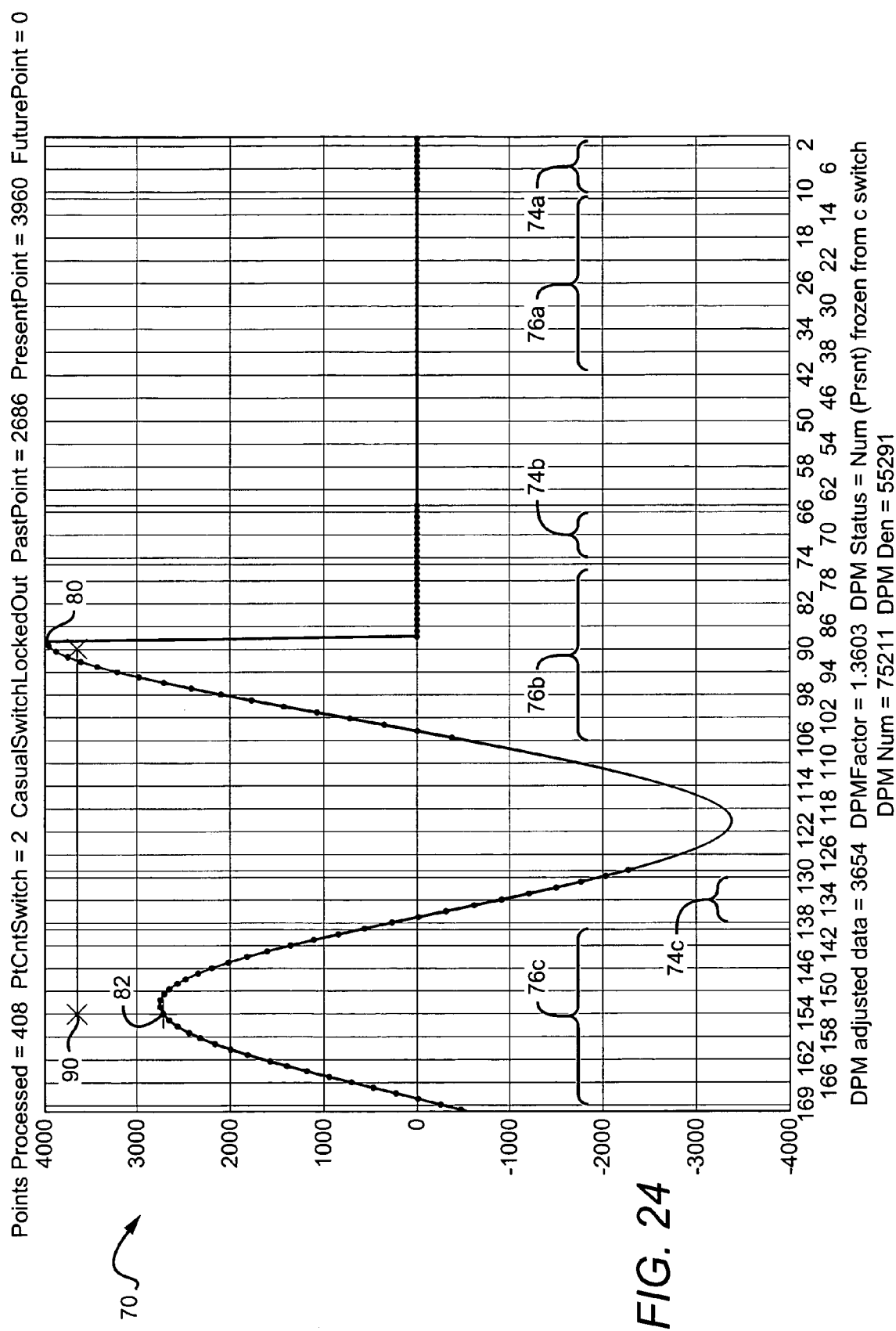
FIG. 24 shows the waveform of FIG. 23, 14 data points later in time.

FIG. 24 shows the waveform 70 of FIG. 23, 14 points later in time and two points before the causal switch is to be made. As described above, the DPM Status shows that the DPM Num is frozen to prevent the trailing edge from corrupting the DPM Num and DPM Factor.

Figure 25:
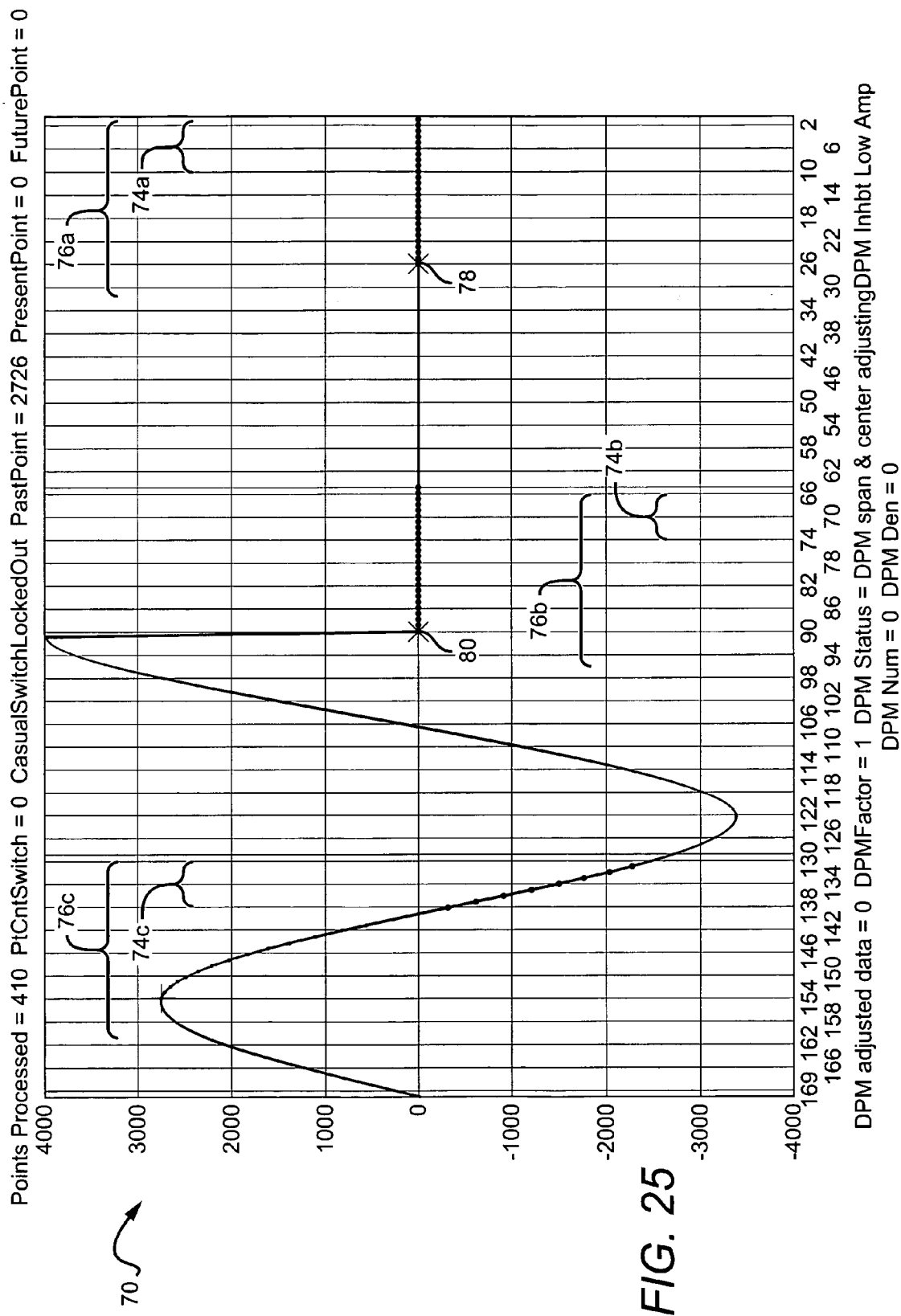
FIG. 25 shows the waveform of FIG. 24, two data points later in time.
Figure 26:
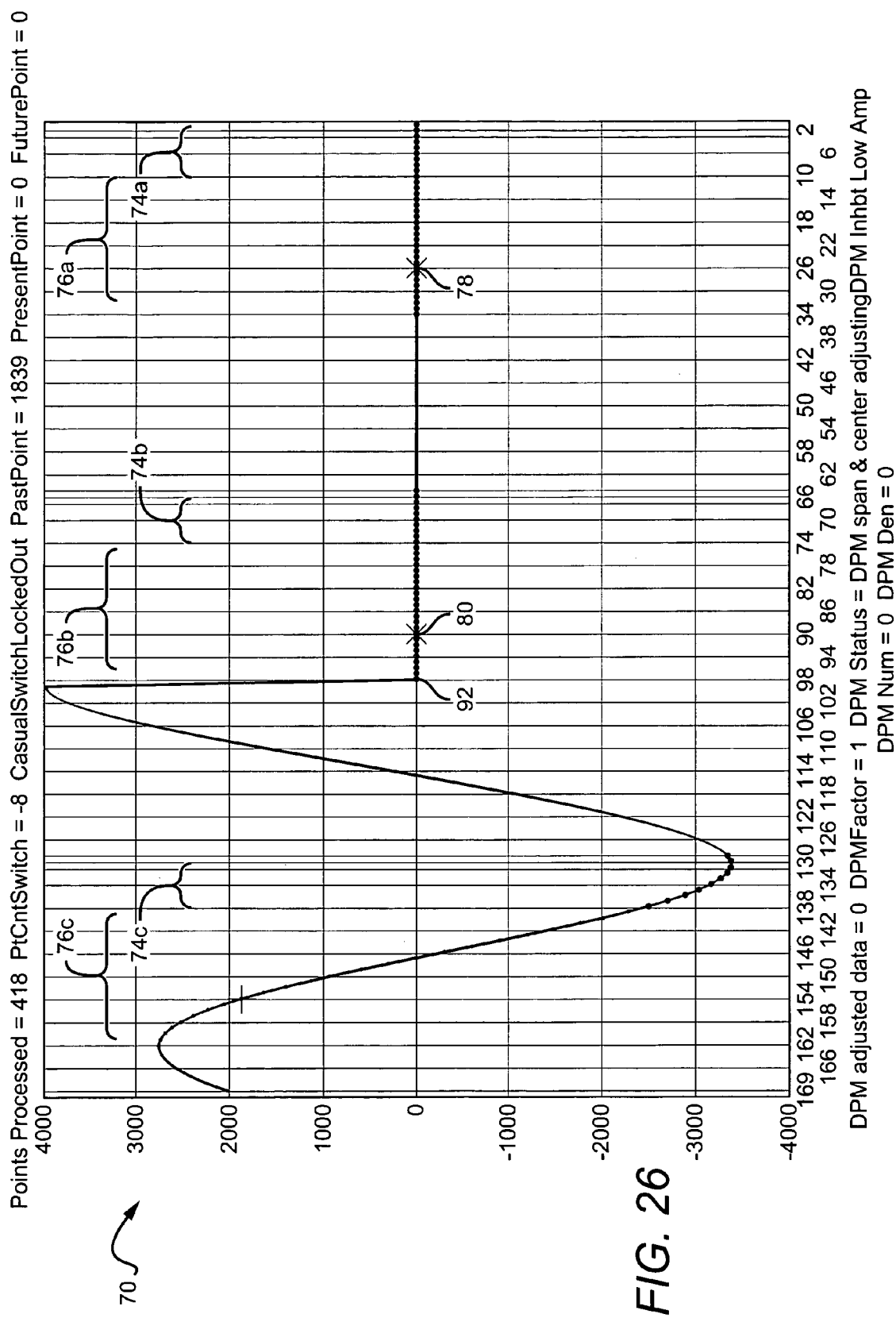
FIG. 26 shows the waveform of FIG. 25, eight data points later in time.
Figure 27:
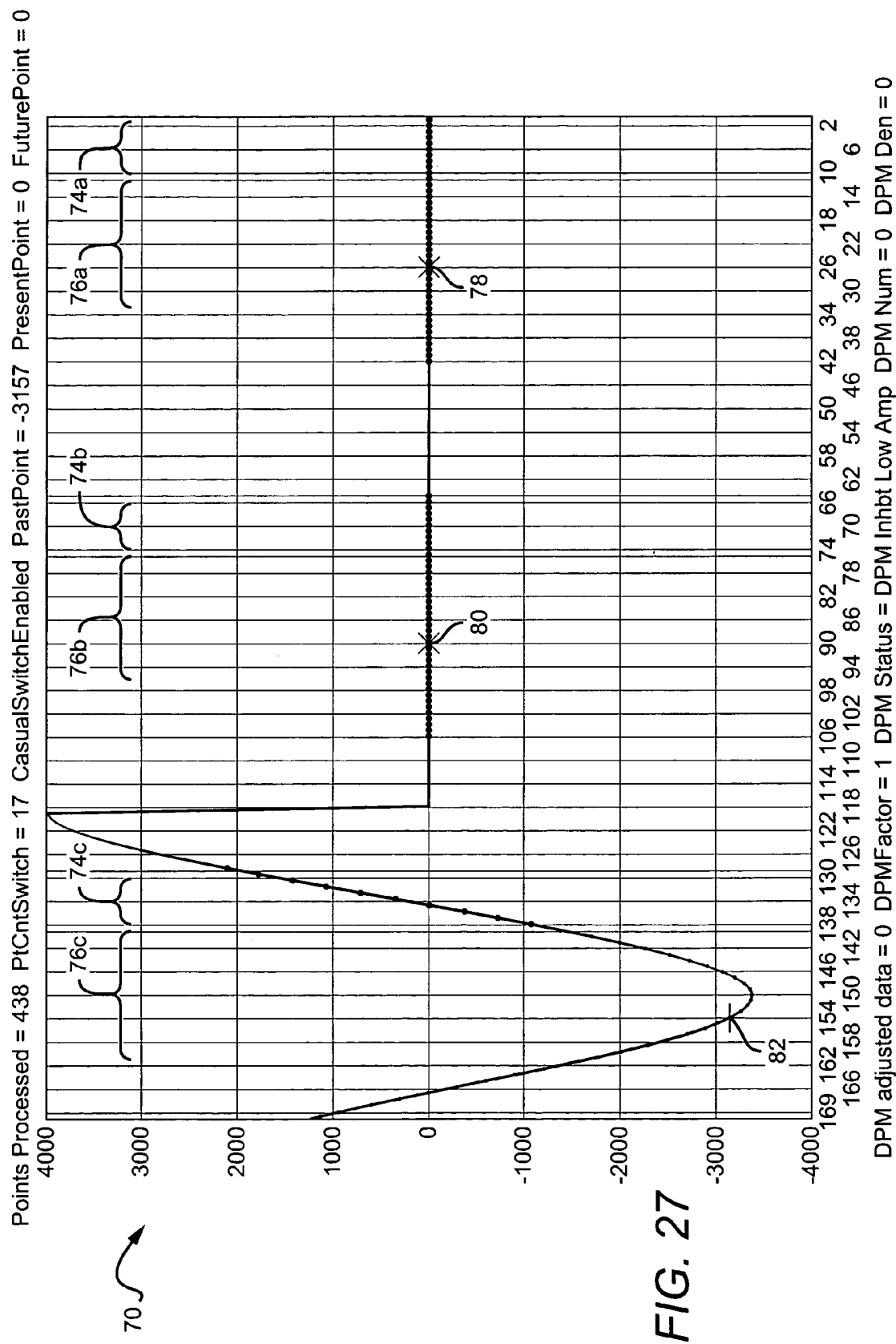
FIG. 27 shows the waveform of FIG. 26, 20 data points later in time.

FIG. 25 shows the waveform 70 after the causal/non-causal switch has been made to the present/future with the DPM span and center adjusted accordingly, as described above in conjunction with FIGS. 12 and 13, FIG. 26 shows the same waveform 70 8 points later after the DPM regions 76c, 76b, 76a have reached their maximum size and the regions 74c, 74b, 74a begin to appear again for the causal determination. FIG. 27 shows the system after the causal regions 74c, 74b, 74a are back to their maximum sizes and the CausalSwitch is enabled.

Figure 28:
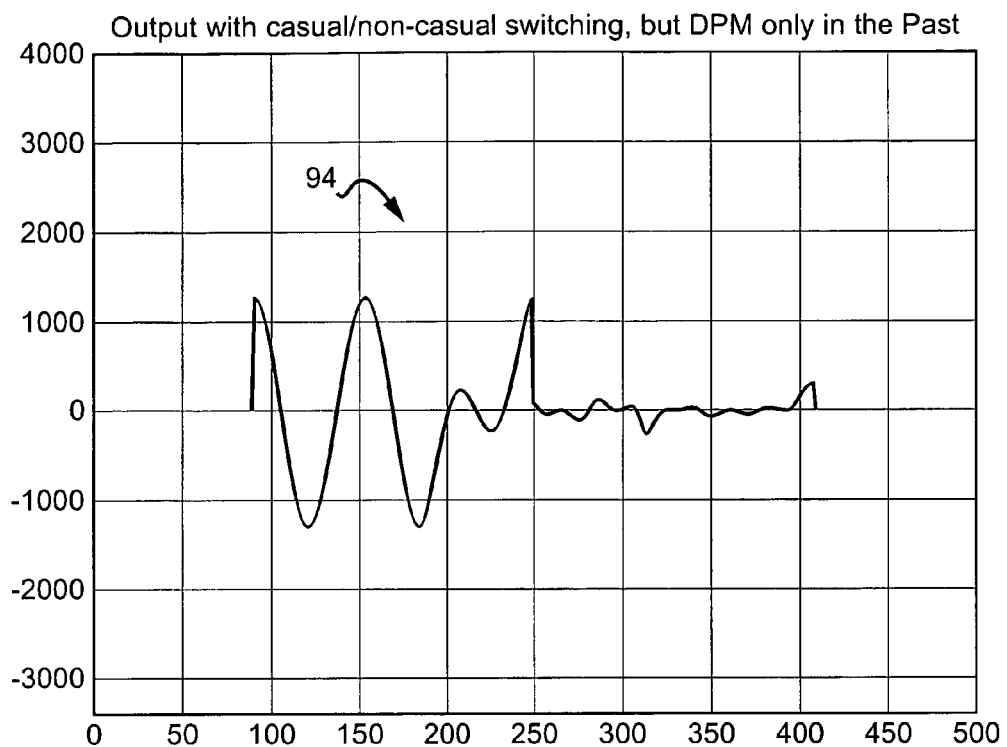
FIG. 28 shows the waveform of FIG. 8 using the present/past for arc detection with a DPM.

As described above, the DPM Module is adapted to work with the causal switching of the EAMS to avoid false arch alarms from signals decaying or increasing in amplitude. FIG. 28 shows a waveform 94 that is similar to the waveform 60 of FIG. 8, but includes a DMP adjustment using only a present/past approach. This results in an improvement, but the first half of the waveform still has the components/artifacts from the first half of the waveform in FIG. 8. This is the result of the DPM needing one and a half cycles to gather the information for the DPM to make the DPM adjustment working with the past only. This is one way to implement the DPM Module, but is not the most efficient.

Figure 29:
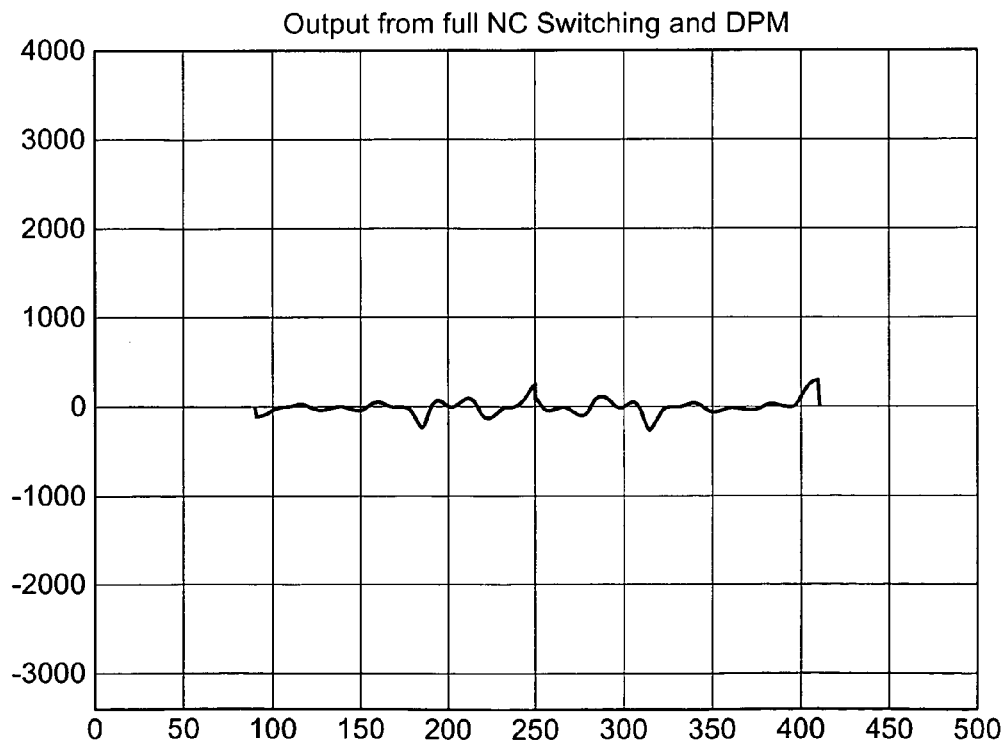
FIG. 29 shows the waveform of FIG. 8 with using causal/non-causal and DPM for arc detection.

FIG. 29 shows a waveform 96 that is similar to the waveform 94 in FIG. 28 but with the DPM Module utilizing the past/present and future/present causal/non-causal logic for its DPM adjustment. The artifacts from the waveform in FIG. 8 are reduced or eliminated, preventing most false alarms. The EAMS is essentially left with monitoring the actual arcing events instead of artifacts from decaying/increasing signal amplitude.

The hardware used to implement this method/system is known in the art and can include the method programmed on a PLD or ASIC. An alternative hardware embodiment utilizes a microcontroller and a digital signal processor (DSP), both of which are known in the art. FIGS. 5, 6, and 7 of U.S. Patent Publication No. US 2003/0227290 A1, previously incorporated by reference, shows an analog and digital embodiment of systems for causal/non-causal determination for arc monitoring. Many different systems can be used according to the present invention, including systems hybrids of digital and analog circuits as well as systems where much of the processing is handled by software.

Figure 30:
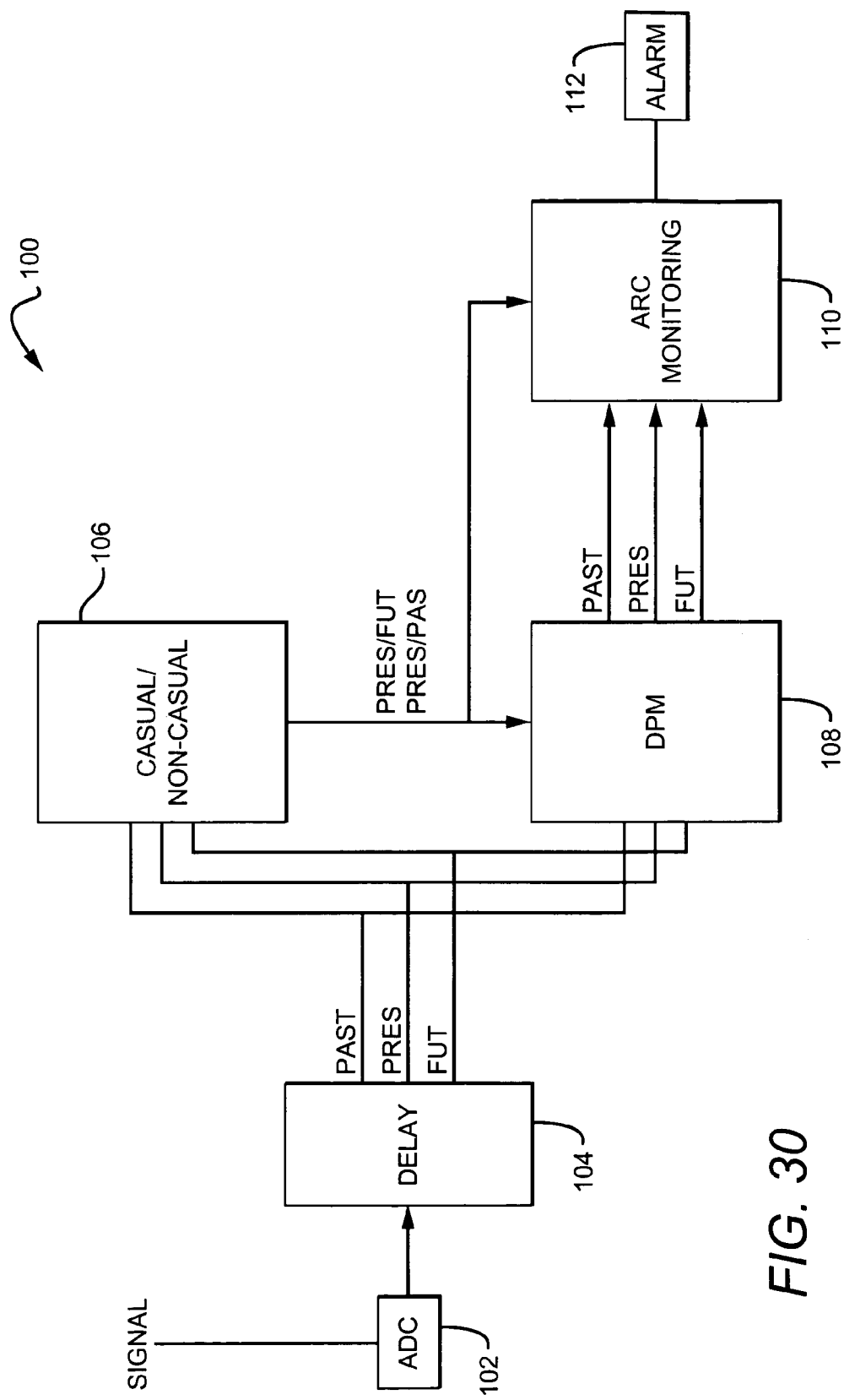
FIG. 30 is a simplified block diagram of one embodiment of an EAMS and DPM system according to the present invention.
Figure 31:
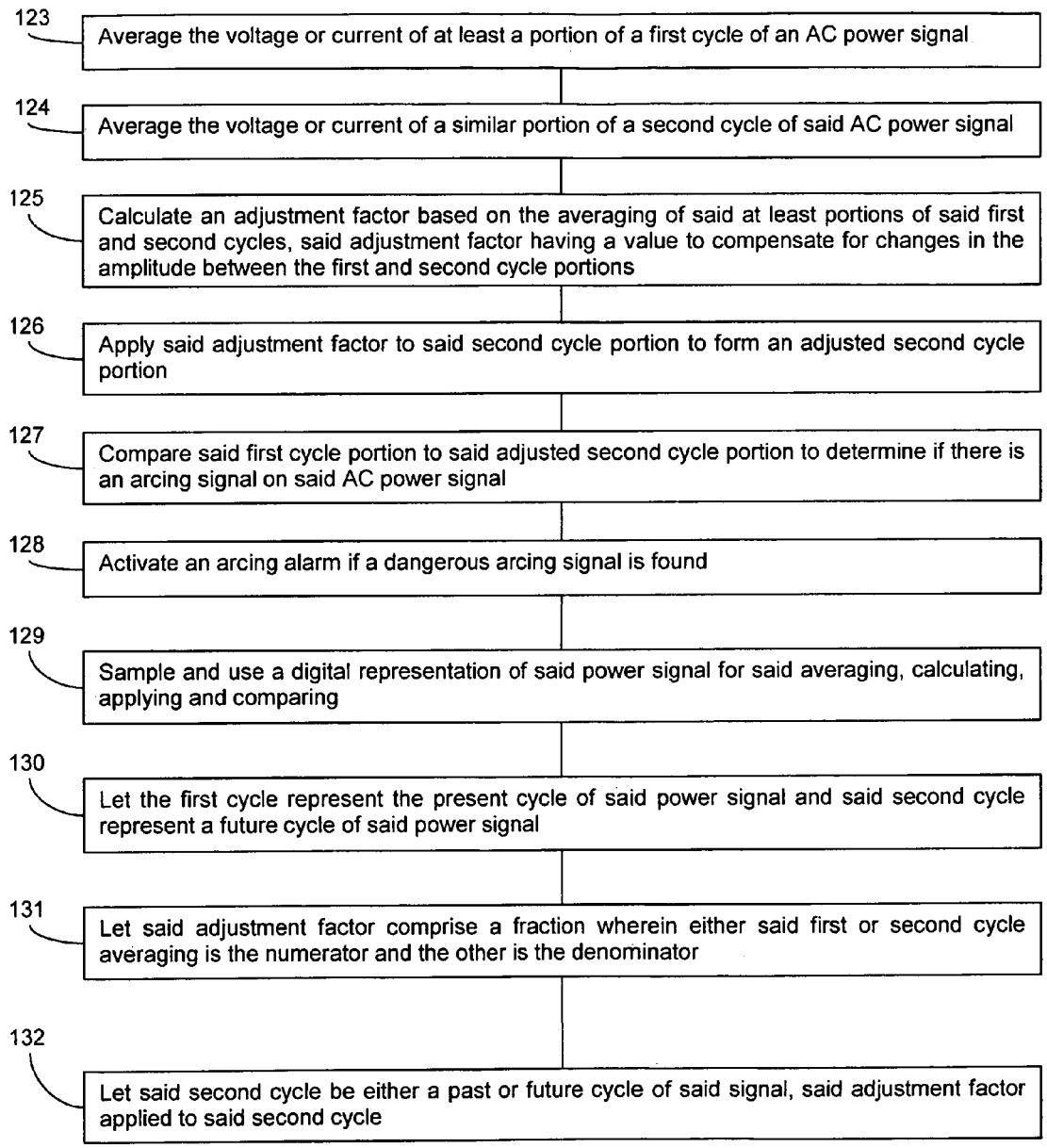
FIG. 31 shows one embodiment of a method in accordance with the invention.

FIG. 30 shows a simplified block diagram one embodiment of a digital based system 100 according to the present invention for arc monitoring using a DPM. The monitored AC power signal is coupled to an analog to digital converter (ADC) 102 where it is sampled and the sampled points on the analog circuit are converted to digital representations that are then coupled to a delay circuit 104. The delay logic 104 provides past, present and future points from the cycles in the signal that are then coupled to the causal/non-causal determination logic 106 and the DPM 108. The causal/non-causal logic 106 makes a determination as whether to used present/future or present/past for arc monitoring purposes. The causal/non-causal logic 106 signals the DPM 108 regarding which is being used for arc monitoring purposes and the DPM compensates for and decay/increase in the amplitude of the monitored signals. If the present/future is being used for arc monitoring the DPM 108 focuses on any decay/increase in the amplitude of the present compared to the future cycles. If the present/past is being used, then the DPM focuses on decay/increase between the present and past cycles. The past, present, and future points (with any adjustments) are then coupled to the arc monitoring logic 110, which analyzes the signals to determine if a arcing condition is present. If so, the arc monitoring logic can activate an alarm 112, which can be any type of visual, audible or logic alarm.

Although the present invention has been described in considerable detail with reference to certain preferred configurations thereof, other versions are possible. Therefore, the spirit and scope of the appended claims should not be limited to the preferred versions of the invention described in the specification.

I claim:

1. A method for detecting arcing conditions in an alternating current power system having an AC power signal that is decaying or increasing in amplitude, comprising:
    averaging the voltage or current at discrete locations within at least a portion of a first cycle of an AC power signal;
    averaging said voltage or current at discrete locations within a similar portion of a second cycle of said AC power signal;
    calculating an adjustment factor based on said averagings, said adjustment factor having a value to compensate for differences between the first and second cycle portions;
    applying said adjustment factor to said second cycle portion to form an adjusted second cycle portion;
    comparing said first cycle portion to said adjusted second cycle portion to determine if there is an arcing signal; and activating an arcing alarm if a dangerous arcing signal is found.

2. The method of claim 1, wherein said second cycle is either a past or future cycle of said signal, said adjustment factor applied to said second cycle.

3. The method of claim 1, wherein said power signal is sampled and a digital representation of said power signal is used for said averaging, calculating, applying and comparing.

4. The method of claim 1, wherein said first cycle represents the present cycle of said power signal and said second cycle represents a future cycle of said power signal.

5. The method of claim 1, wherein said adjustment factor comprises a fraction wherein either said first or second cycle averaging is the numerator and the other is the denominator.

6. A method for detecting electrical arcs in an electrical system having a power signal with a periodically alternating characteristic while reducing or preventing false alarms from decaying/increasing power signal amplitudes, comprising:
    detecting past, present and future cycles of a power supply signal;
    comparing a region from a present cycle of said signal to a similar region in said past cycle and in said future cycle and making a determination as to which the present cycle would correlate better with for arc monitoring;
    adjusting the amplitude of either said past or future cycles to adjust for amplitude decay or increase of said power supply signal wherein said amplitude adjusting comprises calculating an adjustment factor based on an averaging of at least a portion of said present cycle and an averaging of at least a portion of either said past or future cycles;
    subtracting the present cycle from either said past or future cycle to form an arc signal artifact waveform;
    analyzing said arc signal artifact waveform to determine; and
    generating an alarm if said analyzing said arc signal artifact waveform determines that a dangerous arcing condition exists.

7. The method of claim 6, wherein said adjustment factor comprises a fraction having the averaging of said present cycle as the numerator and the averaging of either said past or future cycles as the denominator.

8. A system for detecting electrical arcs by monitoring an alternating current power supply, comprising:

a sampling circuit which samples electrical signals;

a delay circuit which receives said sampling circuit output and stores a time history of said output over an interval including a past, present and future versions of said history;

causal/non-causal logic which compares said present version with said past and future versions to determine which will be used as an arc monitoring version to compare said present version for arc monitoring;

a dynamic processing module to compensate for any amplitude differences between said present version and said arc monitoring version;

an arc monitoring circuit to analyze said present version and adjusted arc monitoring version to determine if an arc; and an alarm that is activated by said arc monitoring circuit when a dangerous arc signal is found.

9. The system of claim 8, wherein said sampling circuit comprises an analog to digital converter.

10. The system of claim 8, wherein said dynamic processing module calculates an adjustment factor to be applied to said arc monitoring version.

11. The system of claim 10, wherein said adjustment factor comprises a fraction wherein the numerator is the averaging of at least a portion of said present version and the denominator is the averaging of at least a portion of said arc monitoring version.

12. The system of claim 8, wherein said an arc monitoring circuit subtracts either of said present and arc monitoring version from the other.

* * * * *